(12) United States Patent
Merrill

(10) Patent No.: US 7,132,724 B1
(45) Date of Patent: Nov. 7, 2006

(54) COMPLETE-CHARGE-TRANSFER VERTICAL COLOR FILTER DETECTOR

(75) Inventor: Richard B. Merrill, Woodside, CA (US)

(73) Assignee: Foveon, Inc., Santa Clara, CA (US)

( * ) Notice: Subject to any disclaimer, the term of this patent is extended or adjusted under 35 U.S.C. 154(b) by 204 days.

(21) Appl. No.: 10/411,628

(22) Filed: Apr. 11, 2003

Related U.S. Application Data

(63) Continuation-in-part of application No. 09/884,863, filed on Jun. 18, 2001, now Pat. No. 6,727,521.

(60) Provisional application No. 60/235,249, filed on Sep. 25, 2000.

(51) Int. Cl.
*H01L 31/00* (2006.01)
(52) U.S. Cl. .............. 257/440; 257/463; 257/E31.084; 438/70; 438/75
(58) Field of Classification Search .............. 257/98, 257/294, 440, 458, 463, 439, E31.084, E31.12, 257/E31.121; 438/60, 66, 70
See application file for complete search history.

(56) References Cited

U.S. PATENT DOCUMENTS

| | | | |
|---|---|---|---|
| 3,971,065 A | 7/1976 | Bayer | 358/41 |
| 4,011,016 A | 3/1977 | Layne et al. | 356/195 |
| 4,238,760 A | 12/1980 | Carr | 357/30 |
| 4,309,604 A | 1/1982 | Yoshikawa et al. | 250/226 |
| 4,318,115 A | 3/1982 | Yoshikawa et al. | 357/30 |
| 4,613,895 A | 9/1986 | Burkey et al. | 358/41 |
| 4,651,001 A | 3/1987 | Harada et al. | 250/330 |
| 4,677,289 A | 6/1987 | Nozaki et al. | 250/226 |
| 4,772,335 A | 9/1988 | Huang | 136/258 |
| 5,397,734 A | 3/1995 | Iguchi et al. | 437/70 |
| 5,502,299 A | 3/1996 | Standley | 250/208.2 |
| 5,583,351 A * | 12/1996 | Brown et al. | 257/89 |
| 5,608,243 A | 3/1997 | Chi et al. | 257/249 |
| 5,668,596 A | 9/1997 | Vogel | 348/222 |
| 5,739,562 A | 4/1998 | Ackland et al. | 257/291 |
| 5,872,371 A | 2/1999 | Guidash et al. | 257/230 |
| 5,883,421 A | 3/1999 | Chouikha et al. | 257/461 |

(Continued)

FOREIGN PATENT DOCUMENTS

EP 0 605 898 7/1994

(Continued)

OTHER PUBLICATIONS

S. Chamberlain, "Photosensitivity and Scanning of Silicon Image Detector Arrays", *IEEE Journal of Solid-State Circuits*, vol. SC-4, No. 6, pp. 333-342, Dec. 1969.

(Continued)

*Primary Examiner*—Brook Kebede
*Assistant Examiner*—Khiem Nguyen
(74) *Attorney, Agent, or Firm*—Sierra Patent Group, Ltd.

(57) ABSTRACT

A vertical-color-filter detector disposed in a semiconductor structure comprises a complete-charge-transfer detector comprising semiconductor material doped to a first conductivity type and has a horizontal portion disposed at a first depth in the semiconductor structure substantially below an upper surface thereof and a vertical portion communicating with the upper surface of the semiconductor structure. The complete-charge-transfer detector is disposed within a first charge container forming a potential well around it. The horizontal portion of the complete-charge-transfer detector has a substantially uniform doping density in a substantially horizontal direction and the vertical portion of the complete-charge-transfer detector has a doping density that is a monotonic function of depth and is devoid of potential wells. A first charge-transfer device is disposed substantially at an upper surface of the semiconductor structure and is coupled to the vertical portion of the complete-charge-transfer detector.

46 Claims, 36 Drawing Sheets

U.S. PATENT DOCUMENTS

| | | | | |
|---|---|---|---|---|
| 5,889,315 | A | | 3/1999 | Farrenkopf et al. .......... 257/552 |
| 5,899,714 | A | | 5/1999 | Farrenkopf et al. .......... 438/202 |
| 5,965,875 | A | * | 10/1999 | Merrill ........................ 250/226 |
| 6,066,510 | A | | 5/2000 | Merrill ......................... 438/57 |
| 6,078,037 | A | | 6/2000 | Booth, Jr. ................. 250/208.1 |
| 6,111,300 | A | | 8/2000 | Cao et al. .................... 257/440 |
| 6,365,270 | B1 | * | 4/2002 | Forrest et al. ............... 428/336 |
| 6,410,899 | B1 | | 6/2002 | Merrill et al. ............ 250/208.1 |
| 6,518,085 | B1 | * | 2/2003 | Wang et al. ................... 438/70 |
| 6,727,521 | B1 | | 4/2004 | Merrill ......................... 257/98 |
| 6,731,397 | B1 | * | 5/2004 | Merrill et al. .............. 358/1.16 |
| 2002/0058353 | A1 | | 5/2002 | Merrill ......................... 438/57 |
| 2004/0185597 | A1 | * | 9/2004 | Merrill et al. ................. 438/70 |

FOREIGN PATENT DOCUMENTS

| | | |
|---|---|---|
| EP | 0707417 | 4/1996 |
| JP | 61-187282 | 8/1986 |
| JP | 01-134966 | 5/1989 |
| WO | WO 98/19455 | 5/1998 |

OTHER PUBLICATIONS

B. Burkey et al, The Pinned Photodiode For an Interline-Transfer CCD Image Sensor, *1984 IEDM*, pp. 28-31, Dec. 9-12, San Francisco, CA 1984.

R. Wolffenbuttel et al., "A Novel Approach to Solid-State Colour Sensing", *Senors and Actuators*, vol. 9, pp. 199-211, 1986, no month.

R. Wolffenbuttel et al., "Performance of an Integrated Silicon Colour Sensor with a Digital Output in Terms of Response to Colours in the Colour Triangle", *Sensors and Actualtors*, vol. A21-A23, pp. 574-580, 1990, no month.

P. Seitz et al., "Smart optical and image sensors fabricated with industrial CMOS/CCD semiconductor processes", *SPIE*, vol. 1900, pp. 21-30, Jul. 1993.

J. Kramer, "Photo-ASICs: Integrated Optical Metrology Systems with Industrial CMOS Technology", *Doctorial Dissertation: Diss Eth Nr. 10186*. MSc Imperial College of Science and Technolgy, pp. 44-47, 1993.

M. Chouikha et al, "Color sensitive photodetectors in standard CMOS and BiCMOS technologies", *SPIE*, vol. 2950, pp. 108-120, Aug. 1996.

H. Wong, "Technology and Device Scaling Considerations for CMOS Imagers", *IEEE Transactions on Electron Devices*, vol. 43, No. 12, Dec. 1996.

K. Parulski et al, "Enabling technologies for a family of digital cameras", *SPIE*, vol. 2654, Paper 18, pp. 156-163, 1996, no month.

B. Weibel, "High-end digital cameras can make professional indoor photography a snap", *Buyers Guide*, pp. 311-317, Apr. 1997.

D. Sutherland, "Neaveau Niche-Part 1: The Latest in digital SLRs", *Shutterbug*, pp. 200-209, Nov. 1997.

M. Chouikha et al, "Buried Triple p-n Junction Structure in a BiCMOS Technology for Color Detection", *IEEE BCTM 6.4*, pp. 108-111, Sep. 1997.

A. Theuwissen, "Fundamentals of Solid-State Imaging", *Solid-State Imaging with Charge-coupled Devices*, pp. 131-141, 1995 Reprinted with corrections 1996,1997.

R. Guidash, "A 0.6 um CMOS Pinned Photodiode Color Imager Technology", *IEDM*, pp. 927-929, 1997, no month.

D. Knipp et al, "Low Cost Approach to Realize Novel Detectors for Color Recognition", *Proc. ICPS 98* (International Congress on Imaging Science), pp. 350-353, Sep. 1998.

H. Miura et al, "A 100 Frame/s CMOS Active Pixel Sensor for 3D-Gesture Recognition System" 1999 IEEE International Solid-State Circuits Conference, pp. 142-143, Jun. 1999.

Stiebig et al., Transient Behavior of Optimized nipiin Three-Color Detectors, *IEEE Transactions on Electron Devices*, vol. 45, No. 7, pp. 1438-1443, Jul. 1998.

* cited by examiner

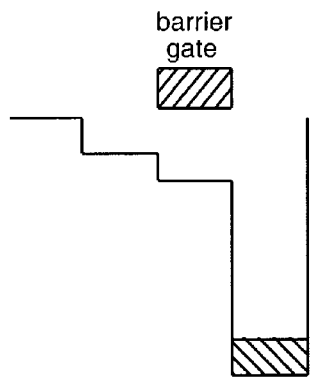 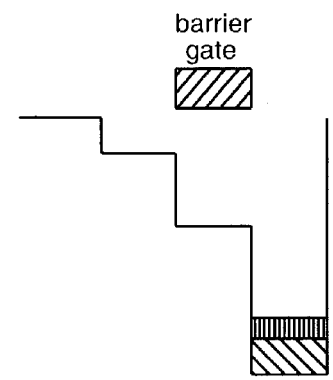
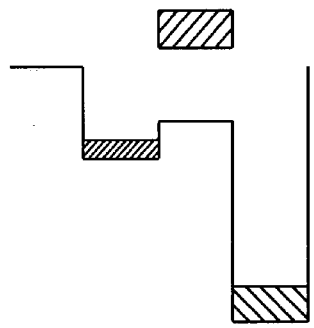 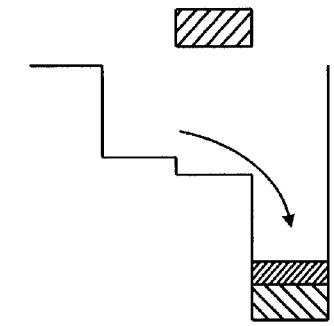
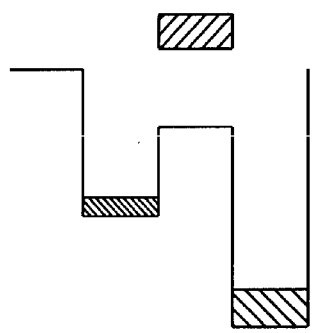 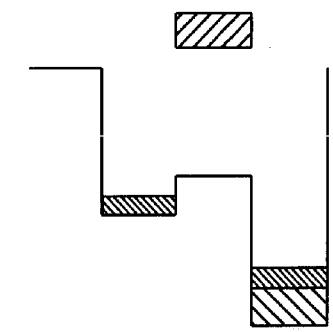
FIG. 16C          FIG. 16D

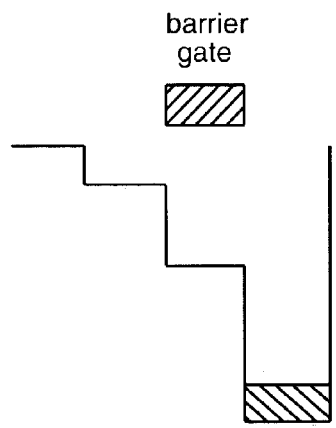 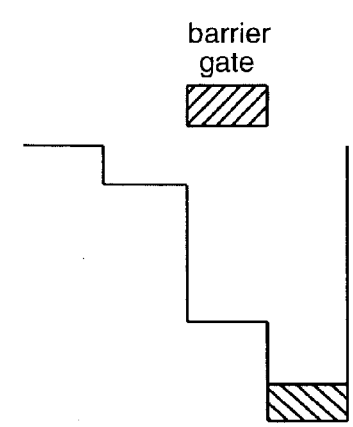
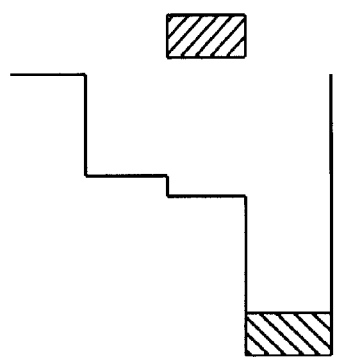 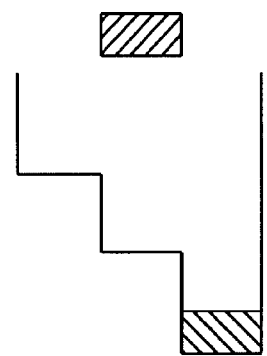
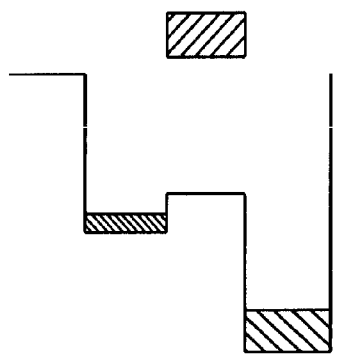 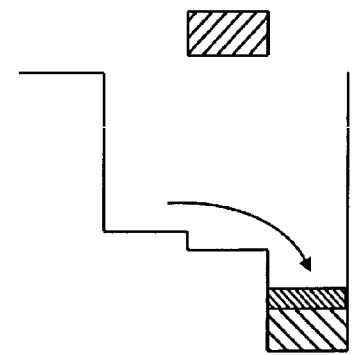
FIG. 16E  FIG. 16F

COMPLETE-CHARGE-TRANSFER VERTICAL COLOR FILTER DETECTOR

RELATED APPLICATIONS

This application is a continuation-in-part of prior co-pending application Ser. No. 09/884,863 filed on Jun. 18, 2001 and assigned to the same assignee as the present invention, now U.S. Pat. No. 6,727,521, which claims the benefit of U.S. Provisional Patent Application No. 60/235,249, filed on Sep. 25, 2000.

BACKGROUND OF THE INVENTION

1. Field of the Invention

The present invention relates to the capture of digital images. More particularly, the present invention relates to complete-charge-transfer vertical-color-filter detectors and arrays thereof.

2. The Prior Art

Semiconductor devices for measuring the color of light are known in the non-imaging art. These devices have been built with a variety of technologies that depend upon the variation of photon absorption depth and wavelength. Examples are disclosed in U.S. Pat. No. 4,011,016 entitled "Semiconductor Radiation Wavelength Detector" and U.S. Pat. No. 4,309,604 entitled "Apparatus for Sensing the Wavelength and Intensity of Light." Neither patent discloses either a structure for a multi-color integrated-circuit color sensor or an imaging array.

In the imaging art, prior CCD devices with multiple buried channels for accumulating and shifting photo charges are known. These devices are difficult and expensive to manufacture and have not been practical for three-color applications. U.S. Pat. No. 4,613,895 entitled "Color Responsive Imaging Device Employing Dependent Semiconductor Optical Absorption" discloses an example of such a device. This category also includes devices that use layers of thin film photosensitive materials applied on top of an imager integrated circuit. Examples of this technology are disclosed in U.S. Pat. No. 4,677,289 entitled "Color Sensor" and U.S. Pat. No. 4,651,001 titled "Visible/Infrared Imaging Device with Stacked Cell Structure." These structures are also difficult and expensive to produce and have not become practical.

Also known in the imaging art are color-imaging integrated circuits that use a color filter mosaic to select different wavelength bands at different photo sensor locations. U.S. Pat. No. 3,971,065, entitled "Color Imaging Array", discloses an example of this technology. As discussed in Parluski et al., "Enabling Technologies for a Family of Digital Camera", 156/SPIE Vol. 2654, 1996 one pixel mosaic pattern commonly utilized in Digital cameras is the Bayer Color Filter Array (CFA) pattern.

Shown in FIG. 1, the Bayer CFA has 50% green pixels arranged in a checkerboard. Alternating lines of red and blue pixels are used to fill in the remainder of the pattern. Color overlay filters are employed to produce the color selectivity between the red, green, and blue sensors. Such sensors have the disadvantage of occupying a relatively large area per pixel as these sensors are tiled together in a plane. As shown in FIG. 2, the Bayer CFA pattern results in a diamond shaped Nyquist domain for green and smaller, rectangular shaped Nyquist domains for red and blue. The human eye is more sensitive to high spatial frequencies in luminance than in chrominance and luminance is composed primarily of green light. Therefore, since the Bayer CFA provides the same Nyquist frequency for the horizontal and vertical spatial frequencies as a monochrome imager, the Bayer CFA improves the perceived sharpness of the digital image.

Mosaic approaches are well known in the art to be associated with aliasing problems due to the sensors being small compared to the spacing between sensors so that the sensors locally sample the image signal, and that the sensors for different colors are in different locations, so that the samples may not align between colors.

Another type of multiple-wavelength sensor employs more than one sensor in a vertically-oriented group. An example of an early multiple-wavelength vertical-color-filter sensor group for detecting visible and infrared radiation is disclosed in U.S. Pat. No. 4,238,760 issued to Carr, in which a first diode in a surface n-type epitaxial region is responsive to visible light and a second buried region in an underlying n-type substrate is responsive to infrared radiation. Contact to the buried photodiode is made using deep diffusion processes similar to diffusion-under-film collector contact common in bipolar IC processing and for $R_{CS}$ reduction. The disclosed device has a size of 4 mils square. An alternative embodiment employs V-groove MOS transistor contacts to contact the buried p-type region of the infrared diode.

The device disclosed in the Carr patent has several shortcomings, the most notable being its large area, rendering it unsuitable for the image sensor density requirements of modern imaging systems. The technology employed for contact formation to the buried infrared sensing diode is also not suitable for modern imaging technology or extension to a three-color sensor.

Referring to FIG. 3, many modern CMOS integrated circuit fabrication processes use a "twin-well" or "twin-tub" process in which a P well region 10 and a N well region 12 of doping density of approximately $10^{17}$ atoms/cm$^3$ are used in regions within which to make N-channel and P-channel transistors respectively. The substrate material 14 is typically a lightly-doped P-type silicon ($10^{15}$ atoms/cm$^3$), so P well 10 is not isolated from substrate 14. The N-channel FET 16 formed in P-well 10 includes N+ normal source/drain diffusions 18 at a dopant concentration of >$10^{18}$ atoms/cm$^3$ and N-type shallow Lightly-Doped-Diffusion (LDD) regions 20 at a concentration of approximately $10^{18}$ atoms/cm$^3$. The P-channel FET 22 formed in N well region 12 is similarly constructed using normal P+ source/drain regions 24 and shallow LDD regions 26 of similar dopant concentrations.

Referring to FIG. 4, in an improved process, known as "triple-well", an additional deep N isolation well 28 is used to provide well isolation between the P well 10 and substrate 14 ($10^{15}$ atom/cm$^3$ and $10^{17}$ atoms/cm$^3$ respectively). Structures in FIG. 4 corresponding to structures in FIG. 3 are identified by the same reference numerals used in FIG. 3. U.S. Pat. No. 5,397,734 titled "Method of Fabricating a Semiconductor Device Having a Triple-well Structure", discloses an example of triple-well technology.

Triple-well processes are becoming popular and economical for manufacturing MOS memory (DRAM) devices, since triple-well processes provide effective isolation of dynamic charge storage nodes from stray minority carriers that may be diffusing through the substrate.

A particular example of a three-color visible-light prior art vertical-pixel-sensor group is shown in FIG. 5A and is disclosed in U.S. Pat. No. 5,965,875 to Merrill. In Merrill, a structure is provided using a triple-well CMOS process including n-well 30 in p-type substrate 32, p-well 34 in n-well 30, and lightly-doped-drain region 36 disposed in p-well 34. The blue, green, and red sensitive PN junctions are seen disposed at different depths beneath the surface of the semiconductor substrate upon which the imager is fabricated.

Another example of a three-color visible-light prior art vertical-pixel-sensor group is shown in FIG. 5B and is disclosed in co-pending United States Patent Application Publication, Pub. No. 2002/0058353 A1, to Merrill. In this vertical-pixel sensor group, a multi-layer structure includes a semiconductor substrate 40 upon which successive epitaxially-deposited p-type silicon layers 42 and 44 are disposed. The red, green, and blue detectors are formed from n-type regions 46, 48, and 50, respectively, disposed in the substrate and the p-type epitaxial layers and are seen located at different depths with respect to the surface of the multi-layer semiconductor structure in which the imager is fabricated. As disclosed in this co-pending application contacts to the red and green detector regions are made using deep contact plug structures 52 and 54 and adjacent vertical-pixel sensor groups are isolated from one another using p-type isolation implants (not shown).

BRIEF DESCRIPTION OF THE INVENTION

According to one aspect of the present invention, a complete-charge-transfer charge-mode-device vertical-color-filter (VCF) detector group and an imaging array of such groups is provided. The term "vertical color filter" is meant to convey that color filtering is implemented by propagation of light vertically through the semiconductor material of the sensor group and array, while "detector group" is meant to imply that several values, typically three color channels, are sensed at the same picture element location of each group in the array. The detector group with three sets of active readout circuits occupies one pixel location in the array. A plurality of individual complete-charge-transfer vertical-color-filter detector groups of the present invention are disposed in an imaging array of such groups.

One complete-charge-transfer vertical-color-filter detector group that is particularly useful in the present invention comprises a plurality of detector layers formed on a semiconductor substrate having different spectral sensitivities based upon different depths in the semiconductor substrate, doping levels, and biasing conditions. In one example of such a detector group, each detector group includes a blue photodetector n-type layer at the surface of the semiconductor, a green photodetector n-type layer deeper in the semiconductor, and a red photodetector n-type layer deepest in the semiconductor.

BRIEF DESCRIPTION OF THE DRAWING FIGURES

FIGS. 16A through 16F are potential diagrams illustrating how the circuitry depicted in FIG. 15 could be used to transfer the charge from all three detectors of the complete-charge-transfer vertical-color-filter detector group of the present invention.

DETAILED DESCRIPTION OF THE INVENTION

Figure 1:
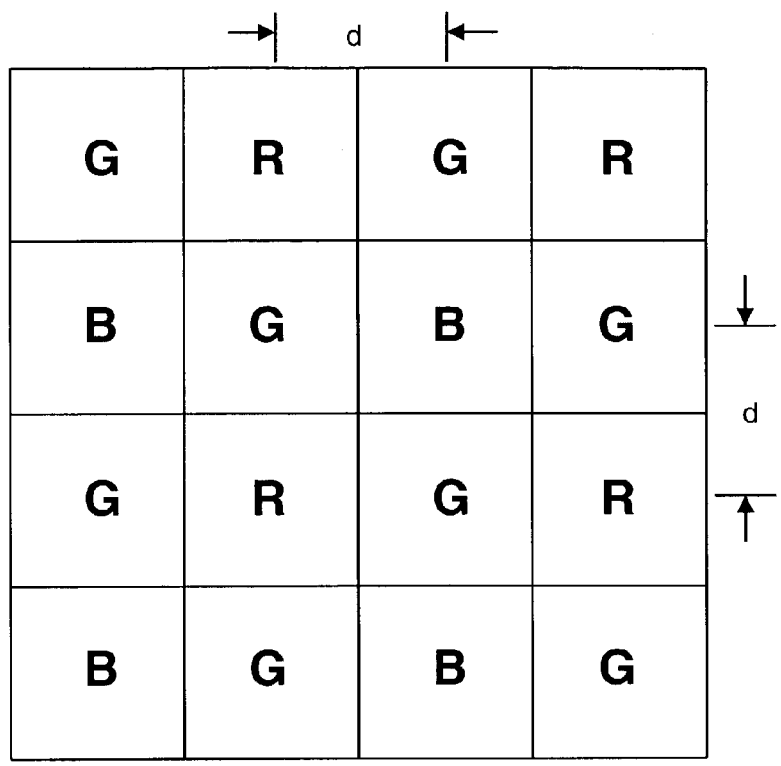
FIG. 1 is a diagram illustrating the well-known Bayer color filter array (CFA) pattern.
Figure 2:
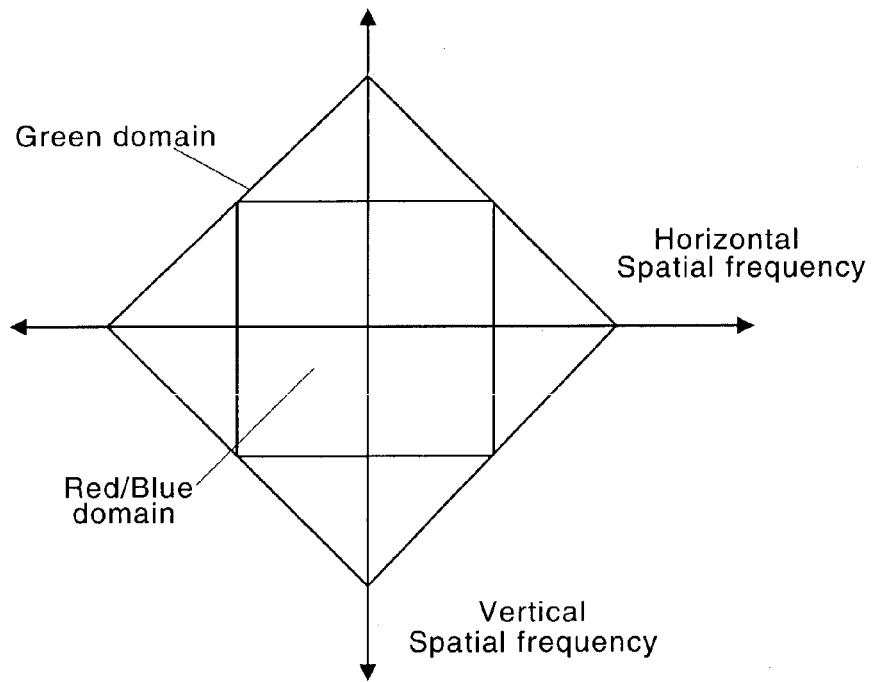
FIG. 2 is a diagram illustrating the Nyquist domains for red, green and blue resulting from the Bayer CFA of FIG. 1.
Figure 3:
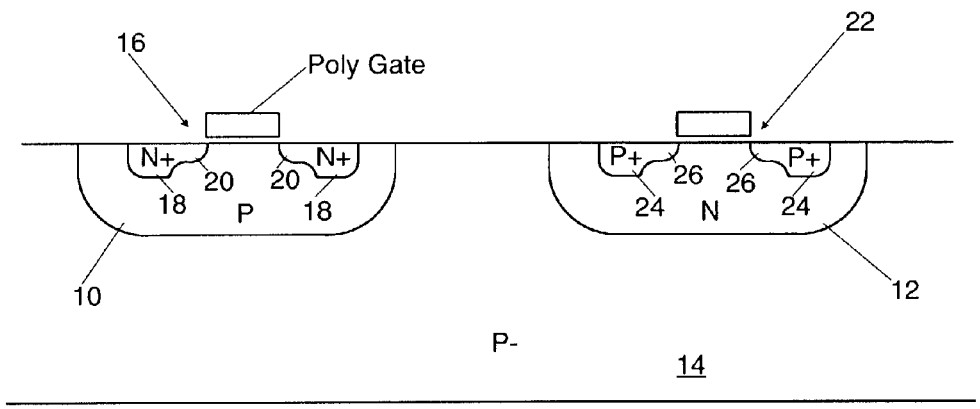
FIG. 3 is a diagram illustrating a partial cross section drawing showing a conventional twin-well CMOS structure.
Figure 4:
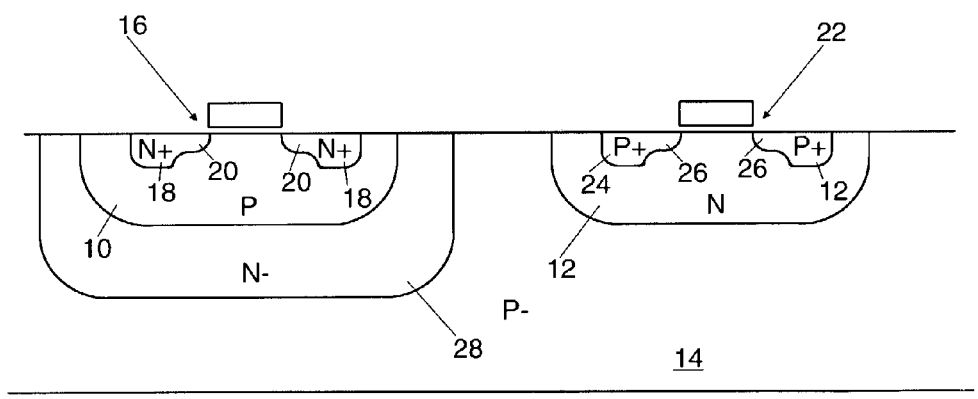
FIG. 4 is a diagram illustrating a partial cross section drawing showing a conventional triple-well CMOS structure.
Figure 5A:
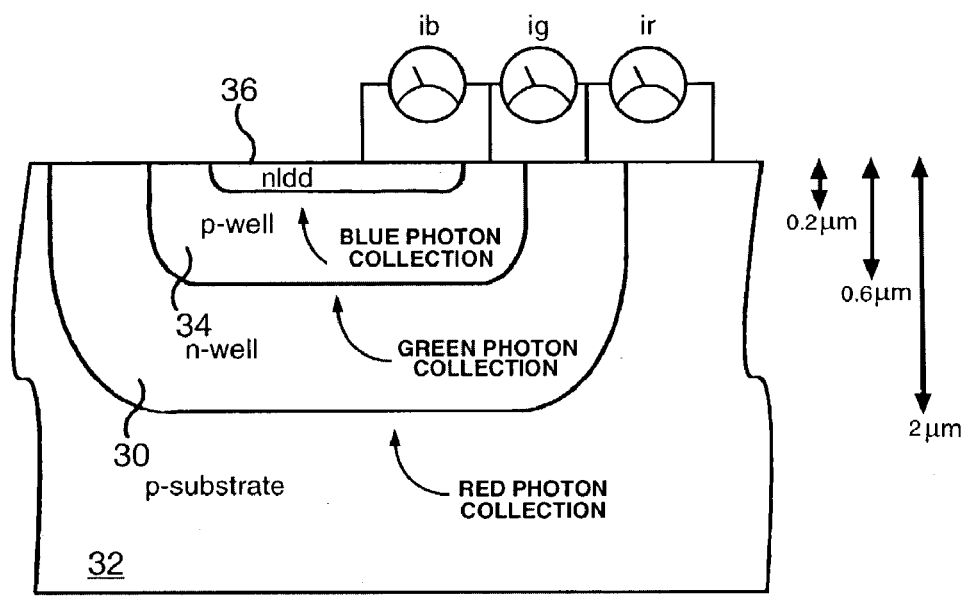
FIG. 5A is a partial cross sectional view of a known three-color vertical-color-filter pixel sensor employing a triple-junction structure.
Figure 5B:
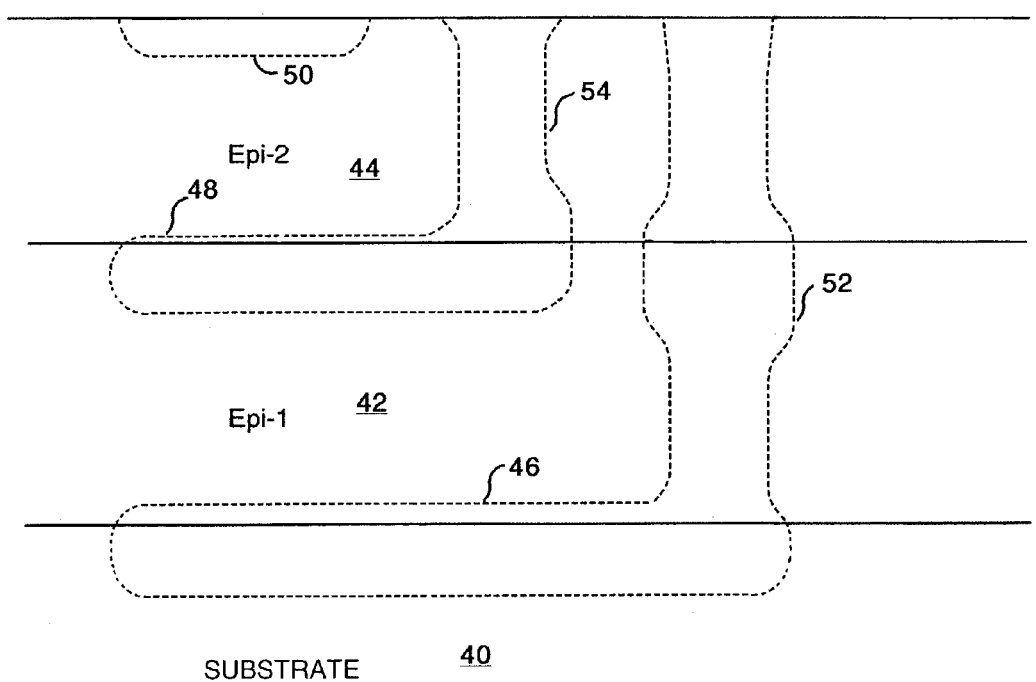
FIG. 5B is a partial cross sectional view of another three-color vertical-color-filter pixel sensor employing a multiple-epitaxial-layer structure.

Persons of ordinary skill in the art will realize that the following description of the present invention is only illustrative and not in any way limiting. Other embodiments of this invention will be readily apparent to those skilled in the art having benefit of this disclosure.

The advantage of a complete-charge-transfer vertical-color-filter detector group is that each pixel location in the array measures three spectral components at the same location, thus minimizing or eliminating the need for interpolation as required by the Bayer patterns. A further advantage of a full RGB imager formed from complete-charge-transfer vertical-color-filter detector groups is that all of the red, green, and blue image information captured for a single pixel location is contained within a smaller space than in the pixel cluster of prior art imaging systems. This smaller space for capture allows finer resolution of the image.

In a typical system in accordance with this invention, the complete-charge-transfer vertical-color-filter detector group vertical-color-filter detector group imager may consist of, for example, an array of 640 by 480 vertical-color-filter detector groups that delivers a total of M=921,600 individual samples of pixel data in the image data set. An illustrative non-limiting example of a denser imager that may be used in accordance with this invention is an imager array that includes a 3,000 by 2,000 array (×3 R, G, B,) for a total of M=18,000,000 photosensors in the array.

The vertical-color-filter detector group imager reduces color-aliasing artifacts by ensuring that all pixel locations in an imaging array measure red, green, and blue color response in the same place of the array structure. Color filtration takes place by making use of the difference in absorption length in silicon of red, green, and blue light.

The complete-charge-transfer vertical-color-filter detector group imager provides advantages in addition to color aliasing. For example, the complete-charge-transfer vertical-color-filter detector group imager eliminates the complex polymer-color-filter-array process steps common in the prior art. The imager also increases the overall efficiency in the use of the available photons. With the traditional approach, photons not being passed by the filter material are absorbed in the filter and wasted. With the approach of this invention, the photons are separated by absorption depth, but most all are collected and used. This can result in overall improvement in quantum efficiency.

It is well known that the longer the wavelength of light incident upon a silicon body, the deeper the light will penetrate into the silicon body before it is absorbed. The blue light having wavelengths in the range of about 400–490 nm will be absorbed in a silicon body at a depth of about 0.2–0.5 microns, green light having wavelengths of about 490–575 nm will be absorbed in the silicon body at a depth of about 0.5–1.5 micron, and red light having wavelengths in the range of about 575–700 nm will be absorbed in the silicon at a depth of about 1.5–3.0 microns.

Figure 6:
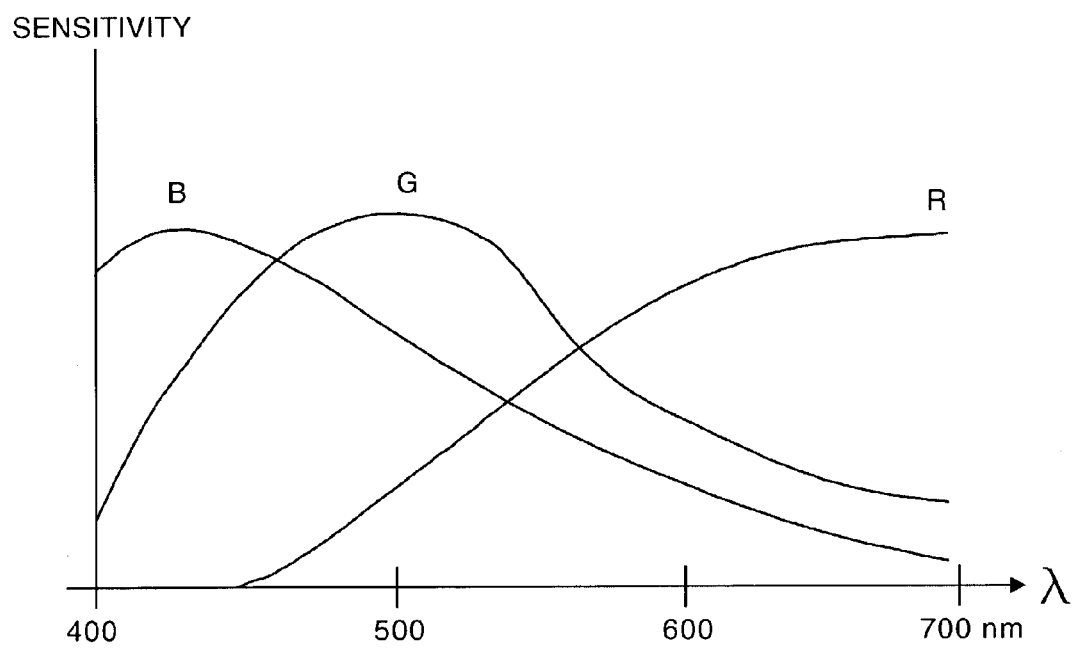
FIG. 6 is a graph showing a set of estimated sensitivity curves for the complete-charge-transfer vertical-color-filter detector group of the present invention.

FIG. 6 presents a set of estimated sensitivity curves for the complete-charge-transfer vertical-color-filter detector group of this invention, as a function of wavelength within the visible spectrum. The curves are only rather broadly tuned, as shown, rather than sharply tuned as in some color separation approaches that are based on color filters. However, as is well known in the art of color imaging, it is possible with suitable linear transformation to convert three-color measurements from such a set of curves into a more nearly colormetrically correct set of red green, and blue intensity values. Methods for estimating suitable matrix transformations are known in the art, and are disclosed, for example in U.S. Pat. No. 5,668,596, entitled "Digital Image Device Optimized for Color Performance."

Figure 7:
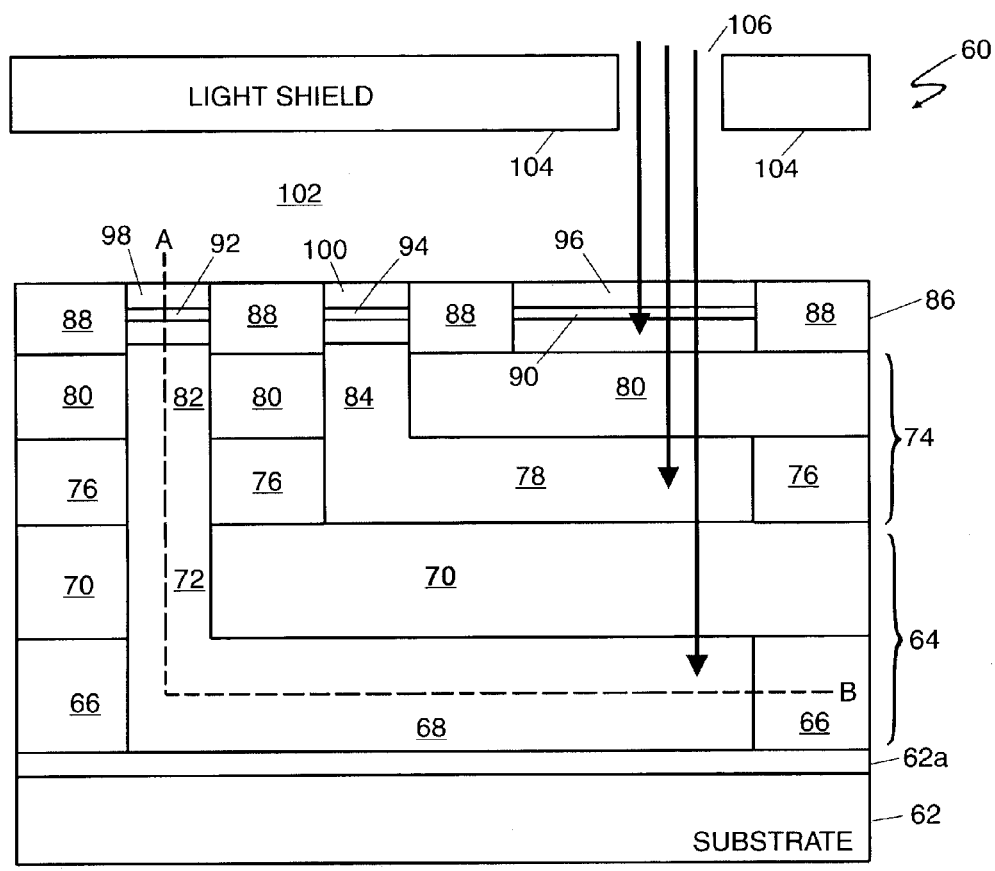
FIG. 7 is a semiconductor cross sectional diagram of an illustrative complete-charge-transfer vertical-color-filter detector group according to the invention.

FIG. 7 shows an illustrative and non-limiting example of a complete-charge-transfer vertical-color-filter detector group that may be used to practice the present invention. Detector group 60 is a six-layer structure that is shown schematically in cross-sectional view fabricated on p-type semiconductor substrate 62. The complete-charge-transfer vertical-color-filter detector group of the present invention can be fabricated in a number of different ways and is thus generally shown in FIG. 7.

P-type substrate 62 may comprise, for example, a p-type wafer doped to about 1e18 $cm^3$. Persons of ordinary skill in the art will appreciate that a silicon overlayer 62a doped to about 1e16 $cm^3$ could be formed to a thickness of, for example, 0.1 micron over substrate 62 using methods such as epitaxial deposition.

According to an illustrative embodiment of the invention, a layer 64 of approximately 2 microns of p-type silicon doped to about 1e16 is disposed over substrate 62 (or epitaxial layer 62a) and may be formed by methods such as epitaxial deposition.

A lateral container for the red detector is formed by masking and doping regions 66 of layer 64 surrounding red detector 68 to about 1e18 as shown in FIG. 7. A p-type layer 70 having a thickness of about 0.25 microns and doped to about 1e18 is disposed over p-type layer 64 and serves as a vertical container for the red detector 68. Region 72 of layer 70 is masked from this doping step to provide access through p-type layer 70 to the charge for the red detector 68.

A p-type layer 74, which may have a thickness of about 1 micron and is doped to about 1e15 is disposed over p-type layer 70. A lateral container for the green detector 78 is formed by masking and doping the regions 76 of layer 74 surrounding green detector 78 to about 1e17 as shown in FIG. 7. A p-type layer 80 having a thickness of about 0.25 microns and doped to about 1e17 is disposed over p-type layer 74 and serves as a vertical container for the green detector. Regions 82 and 84 of layer 80 are masked from this doping step to provide access through p-type layer 80 to the charge for the red and green detectors, respectively.

A lightly-doped p-type silicon layer 86, which may have a thickness of about 0.25 micron is disposed over p-type layer 80. Regions 88 of layer 86 are oxidized to provide isolation regions. A subsurface region in the remainder of layer 86 is doped with an n-type dopant to a concentration of about 1e16 to form the blue-photodiode detector region 90 and two other portions of the structure 92 and 94 to serve as part of the structure of the charge transfer devices for the red and green channels. P-type surface passivation regions 96, 98, and 100 are defined and doped to about 1e18 over blue-photodiode detector region 90, and over n-type regions 92 and 94, respectively. Although out of the plane of the figure and thus not shown in FIG. 7, small n-type regions contacting n-type regions 90, 92, and 94 are formed in p-type surface passivation regions 96, 98, and 100 to form other parts of the structure of the charge transfer devices for the blue, green, and red channels. These small n-type regions are shown clearly in the embodiment of FIG. 9. A passivation layer 102 is formed over the surface of the structure and a light shield 104 is disposed over the structure and has an aperture 106 formed therein to allow light to pass into the structure only in the desired detector regions.

The entire area on the substrate over which the aforementioned layers are formed may be thought of as the area of an array of vertical-color-filter detector groups. The regions 66 of layer 64, the right- and left-edge portions of layers 70 and 80, regions 76 of layer 74, and the right- and left-edge oxide regions 88 provide lateral inter-group detector isolation. Persons of ordinary skill in the art will appreciate that other portions of the more-heavily-doped regions 66 and 76 necessary to define the entire lateral periphery of the red and green detectors 68 and 78 are disposed behind and in front of the plane of the figure and thus are not seen in the figure. Inter-group spacing of the complete-charge-transfer verticalcolor-filter detector groups of the present invention may be on the order of about 5 microns.

Figure 8A:
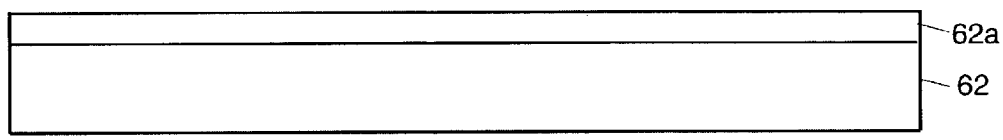
FIGS. 8A through 8H are cross-sectional diagrams showing the structure resulting after completion of selected steps in a fabrication process for a complete-charge-transfer vertical-color-filter detector group of FIG. 7 according to the present invention.

Referring now to FIGS. 8A through 8H, an illustrative semiconductor fabrication process for fabricating the complete-charge-transfer vertical-color-filter detector group of FIG. 7 is illustrated. Referring first to FIG. 8A, the process starts with a p-type semiconductor substrate 62. In an illustrative embodiment, substrate 62 may be doped to a concentration of about 1E18. Epitaxial layer 62a may then optionally be formed over substrate 62 to a thickness of about 0.1 microns and doped to a level of about 1e16 cm$^3$ with a p-type dopant.

Figure 8B:
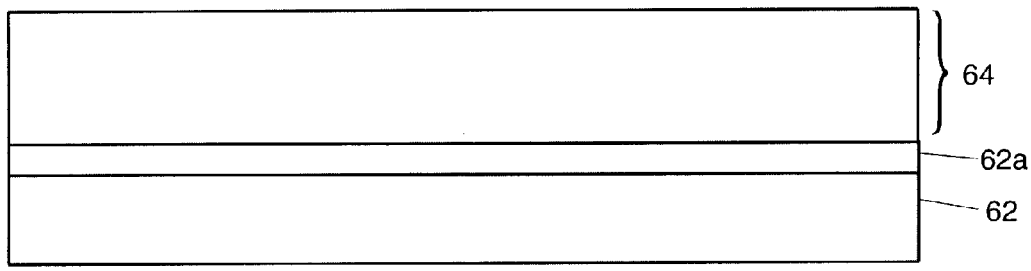

Referring now to FIG. 8B, a p-type layer 64 is formed over substrate 62 (or over epitaxial layer 62a) to a thickness of about 3 microns and doped to a level of about 1e16. FIG. 8B shows the structure resulting after these processing steps have been performed.

Figure 8C:
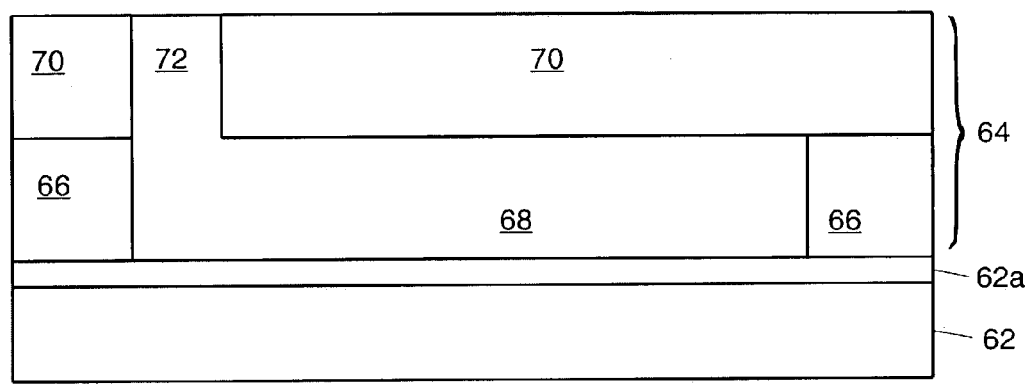

Referring now to FIG. 8C, a masked implant is performed to form regions 66 in layer 64 doped to a higher level of about 1e18 to form the lateral portions of a red charge container, which is located at reference numeral 68 between regions 66. A p-type layer 70 is then formed in the layer 64 by p-type doping to a level of about 1e16. A masked implant is performed to raise the doping level of this layer to about 1e18 to form the vertical portion of the red charge container except in region 72. FIG. 8C shows the structure resulting after these processing steps have been performed.

Figure 8D:
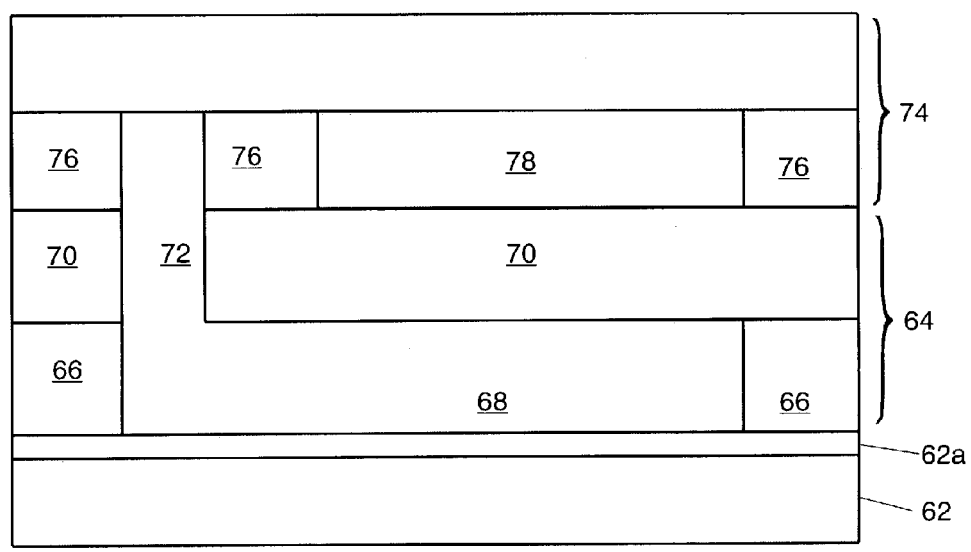

Referring now to FIG. 8D, a p-type layer 74 is then formed over the layer 70 and doped to a level of about 1e15. A masked implant is performed to form regions 76 in layer 74 doped to a higher level of about 1e17 to form the lateral portions of a green charge container around green detector portion 78 and isolation from adjacent detector structures. FIG. 8D shows the structure resulting after these processing steps have been performed.

Figure 8E:
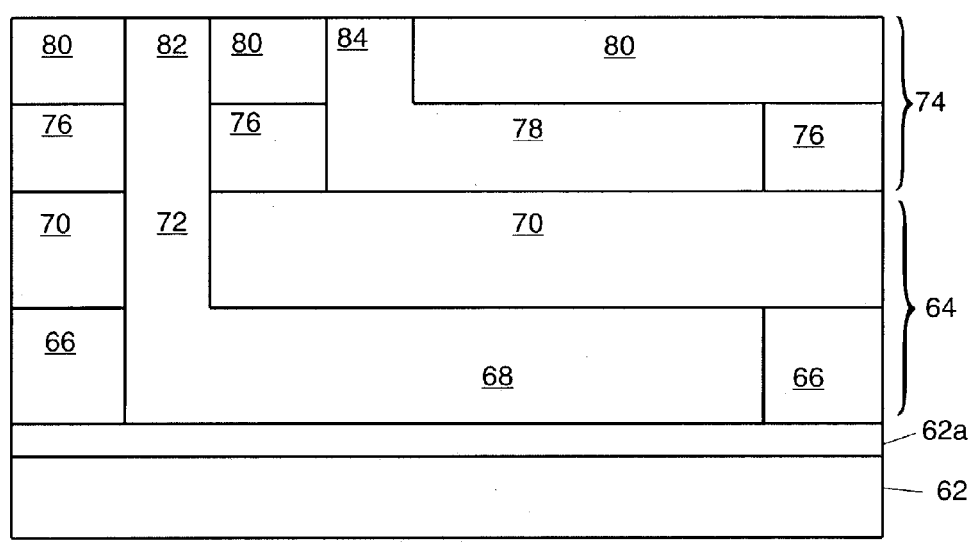

Referring now to FIG. 8E, a p-type layer 80 is then formed in the layer 70 by p-type doping to a level of about 1e15. A masked implant is performed to raise the doping level of this layer to about 1e18 to form the vertical portion of the green charge container except in regions 82 and 84 to allow access to the red and green collectors. FIG. 8E shows the structure resulting after these processing steps have been performed.

Figure 8F:
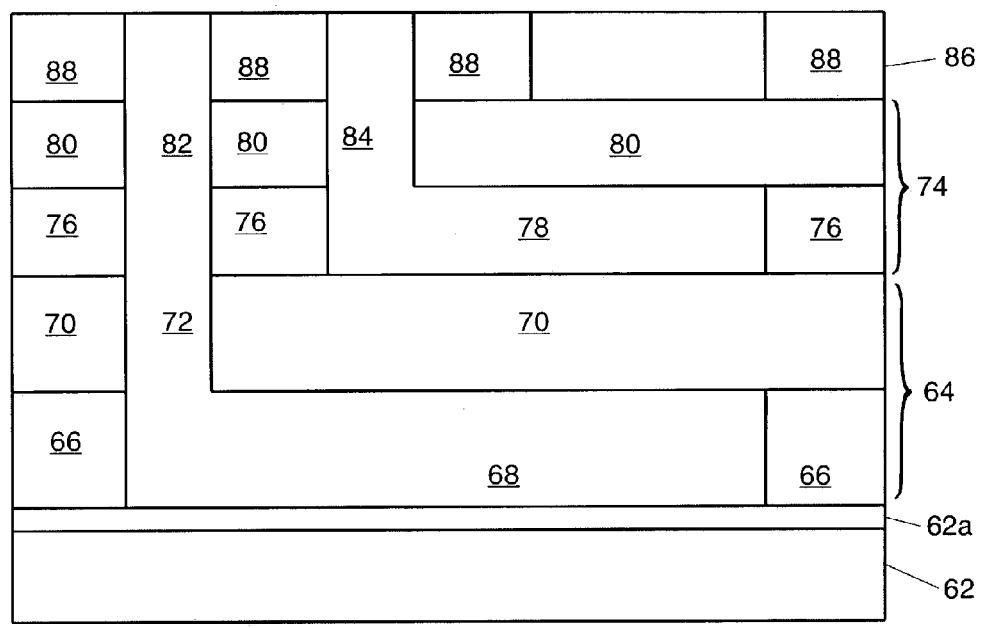

Referring now to FIG. 8F, a lightly-doped layer 86 is then formed over the layer 80. Oxide isolation regions 88 are formed using standard photolithography and oxidation processes. FIG. 8F shows the structure resulting after these processing steps have been performed.

Figure 8G:
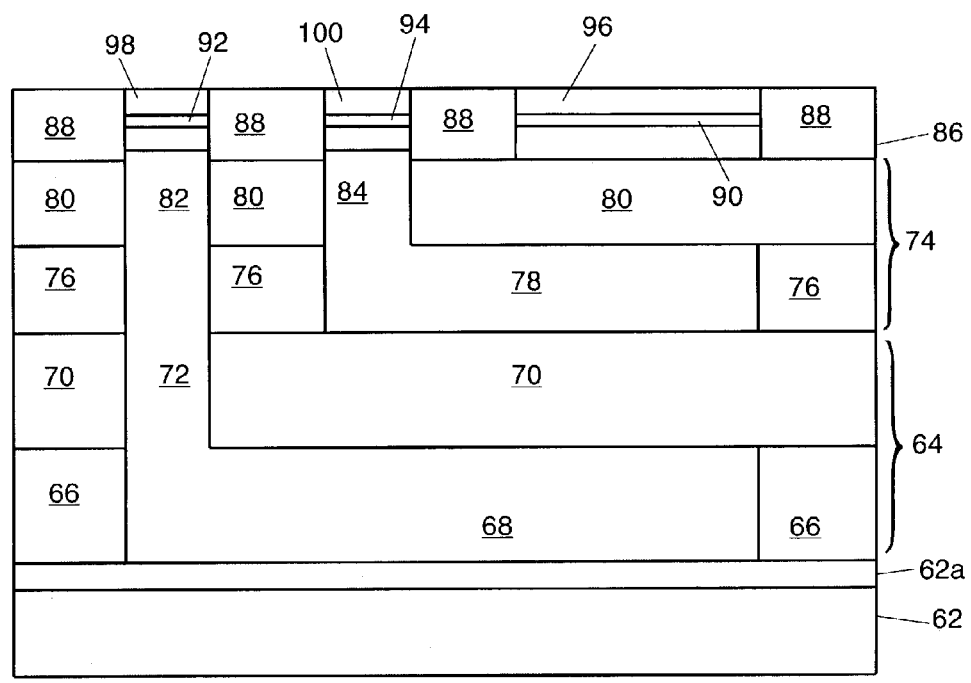

Referring now to FIG. 8G, a blue photodiode n-type region 90, and n-type regions 92 and 94 are defined and implanted to a concentration of about 1e16 in the layer 86 between the oxide isolation regions 88. Surface p-type passivation regions 96, 98, and 100 are then defined and doped to a level of about 1e18. The small n-type contacts are made through the surface p-type passivation regions to the n-type regions 90, 92 and 94. FIG. 8G shows the structure resulting after these processing steps have been performed.

Although out of the plane of the figure and thus not seen in FIG. 8G, additional n-type regions are formed at the surface of the layer 86 at locations spaced apart from p-type surface passivation regions 96, 98, and 100 to form a part of the charge transfer devices for the red, green, and blue channels and to act as sense nodes for the red, green, and blue output signals. These regions, as well as the small n-type contact regions that are also out of the plane of the cross-section of FIG. 8G will be seen and understood from an examination of FIG. 14.

Figure 8H:
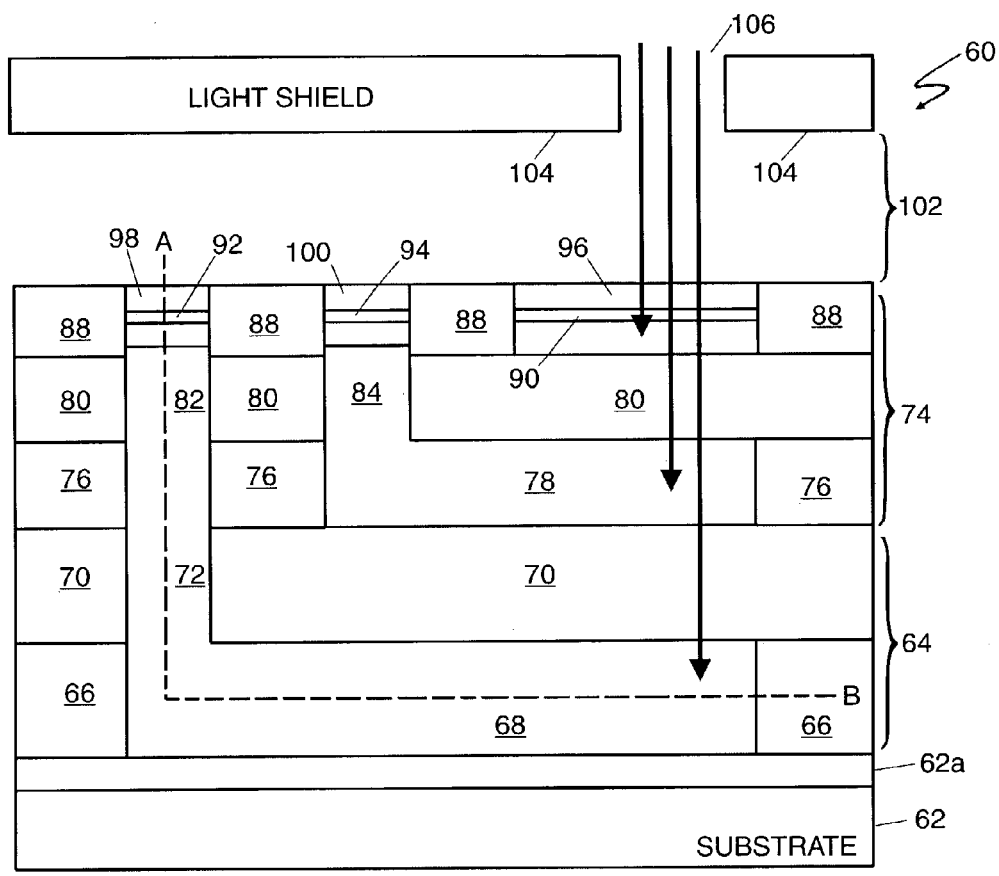

Referring now to FIG. 8H, a passivation layer 102 is formed over the surface of layer 86 and a light shield 104 is formed over passivation layer 102. Light shield 104 has an aperture 106 formed therein to allow light to pass only to the desired detector regions of the structure. FIG. 8H shows the structure resulting after these processing steps have been performed.

Figure 9:
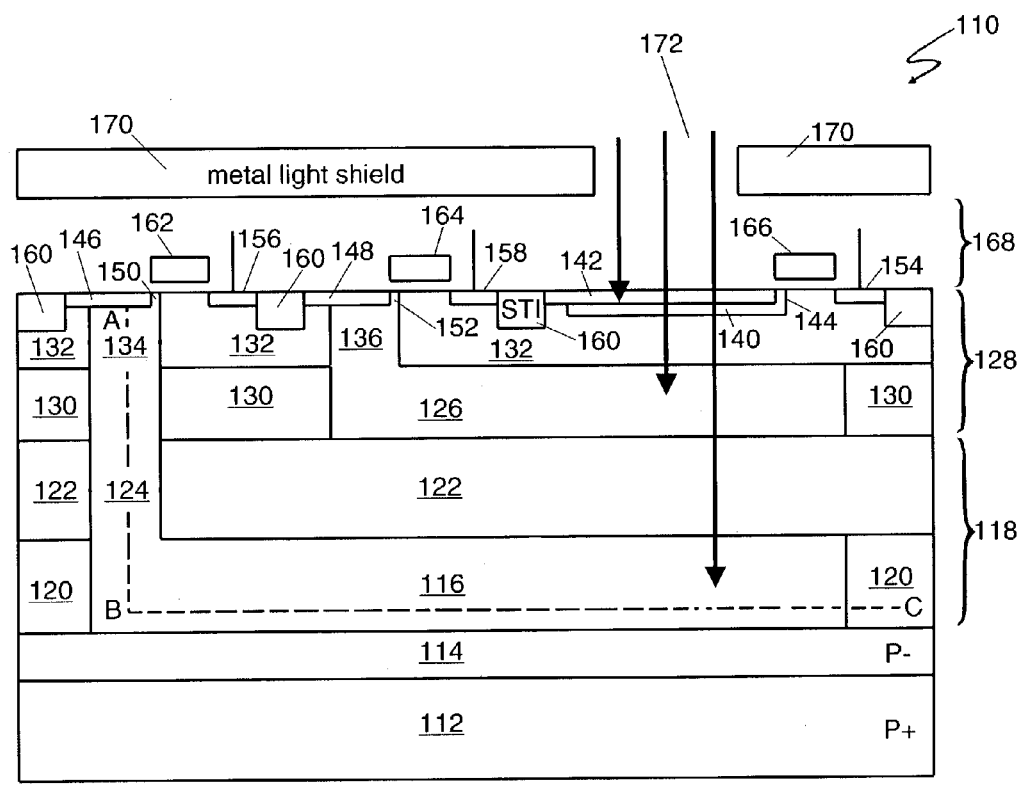
FIG. 9 is a semiconductor cross sectional diagram of another illustrative complete-charge-transfer vertical-color-filter detector group according to the invention.

An alternative method of containing charge according to the present invention involves the formation of pn junctions in the structure. FIG. 9 shows in cross-sectional view another illustrative and non-limiting example of a complete-charge-transfer vertical-color-filter detector group employing junction charge containers that may be used to practice the present invention. Detector group 110 is a six-layer structure that is shown schematically in cross-sectional view fabricated on p-type semiconductor substrate 112. The complete-charge-transfer vertical-color-filter detector group of the present invention can be fabricated in a number of different ways and is thus generally shown in FIG. 9.

P-type substrate 112 may comprise, for example, a p-type wafer doped to about 1e18. According to an illustrative embodiment of the invention, a layer 114 of approximately 2 microns of p-type silicon doped to about 1e16 is disposed over substrate 112 and may be formed by methods such as epitaxial deposition on p-type substrate 112.

The red detector 116 is formed from an n-type layer 118 doped to about 1e16 cm$^3$ and formed over layer 114. A lateral container for the red detector 116 is formed by first masking and doping deep counterdoping peripheral regions 120 of layer 118 surrounding red detector 116 to p-type at a concentration of about 1e16 cm$^3$ as shown in FIG. 9. Next, a shallow counterdoping of region 122 of layer 118 to p-type doped to about 1e16 cm$^3$ is performed to serve as a vertical container for the red detector 116. Region 124 is masked from this doping step to provide access to the charge for the red detector 116.

The green detector 126 is formed from an n-type layer 128 doped to about 1e17 cm$^3$ and formed over layer 118. A lateral container for the green detector 126 is formed by first masking and deep counterdoping peripheral regions 130 of layer 128 surrounding red detector 126 to p-type at a concentration of about 1e17 cm$^3$ as shown in FIG. 9. Next, a shallow counterdoping of region 132 of layer 128 to p-type doped to about 1e17 cm$^3$ is performed to serve as a vertical container for the green detector 126. Regions 134 and 136 are masked from this doping step to provide access to the charge for the red and green detectors, respectively.

Blue detector 138 is formed from a buried n-type doped region 140 in region 132 covered by a p+ surface passivation layer 142 that exposes only a small region 144 of the blue detector 140 at the surface of region 132. Similar p+ passivation layers 146 and 148, which may be formed using the same mask as that used for passivation layer 142, are formed in regions 134 and 136, respectively, exposing only small portions 150 and 152, respectively, of n-type regions 134 and 136 at their surfaces. N-type sense nodes 154, 156, and 158 are spaced apart from surface passivation layer 142 and its accompanying exposed n-type region 144 for the blue detector, surface passivation layer 146 and its accompanying exposed n-type region 150 for the red detector, and surface passivation layer 148 and its accompanying exposed n-type region 152 for the green detector. Shallow-trench isolation regions 160 separate the charge-transfer devices from one another and from adjacent structures in neighboring vertical-color-filter detector groups. Barrier gates 162, 164, and 166 are disposed over and insulated from layer 132 and aligned, respectively, between the small regions 144, 150 and 152, and n-type sense-node regions 154, 156, and 158 in layer 132.

A passivation layer 168 is formed over the structure and a light shield 170 is disposed over the structure and has an aperture 172 formed therein to allow light to pass into the structure only in the desired detector regions.

The entire area on the substrate 112 over which the aforementioned layers are formed will comprise the area of an array of vertical-color-filter detector groups 112. The regions 120, 122 of layer 118 and regions 130 and 132 of layer 128 provide lateral inter-group detector isolation. Persons of ordinary skill in the art will appreciate that other portions of the regions 120, 122 of layer 118 and regions 130 and 132 of layer 128 necessary to define the entire lateral periphery of the red and green detectors 116 and 126 are disposed behind and in front of the plane of the figure and thus are not seen in the figure. Inter-group spacing of the complete-charge-transfer vertical-color-filter detector groups of the present invention may be on the order of about 5 microns.

Figure 10A:
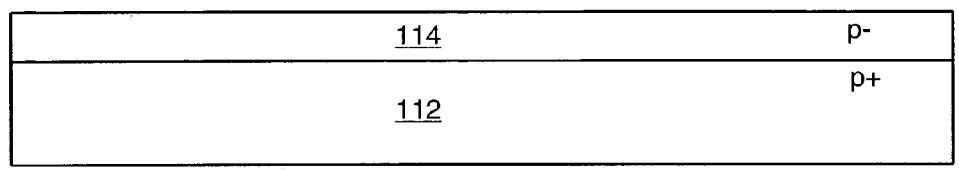
FIGS. 10A through 10I are cross-sectional diagrams showing the structure resulting after completion of selected steps in another fabrication process for a complete-charge-transfer vertical-color-filter detector group of FIG. 9 according to the present invention.

Referring now to FIGS. 10A through 10H, an illustrative semiconductor fabrication process for fabricating the complete-charge-transfer vertical-color-filter detector group of FIG. 9 is shown. Referring first to FIG. 10A, the process starts with a p-type semiconductor substrate 112. In an illustrative embodiment, substrate 112 may be doped to a concentration of about 1e18 cm$^3$. As shown in FIG. 10A, a p-type layer 114 is formed over substrate 112 to a thickness of about 3 microns and doped to a level of about 1e16 by, for example, an epitaxial growth process. FIG. 10A shows the structure resulting after these processing steps have been performed.

Figure 10B:
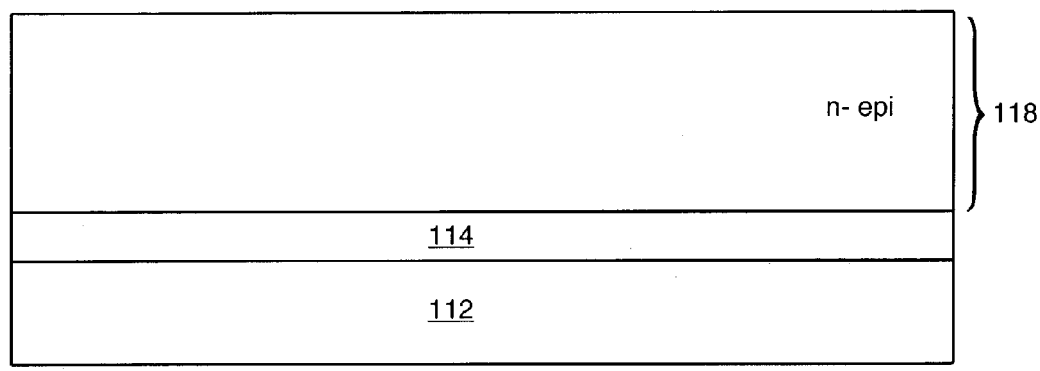

Referring now to FIG. 10B, an n-type layer 118 doped to a level of about 1e16 cm$^3$ is formed over p-type layer 114 to a thickness of about 2 microns by, for example, an epitaxial growth process. FIG. 10B shows the structure resulting after this processing step has been performed.

Figure 10C:
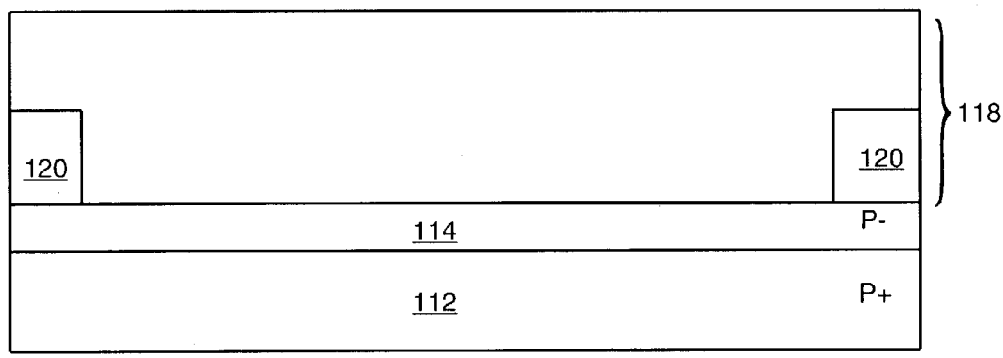

Referring now to FIG. 10C, a masked deep implant is performed to form regions 120 in layer 114 counterdoped to p-type at a level of about 1e16 cm$^3$ to form the lower lateral portions of a red charge container for red detector 116. FIG. 10C shows the structure resulting after these processing steps have been performed.

Figure 10D:
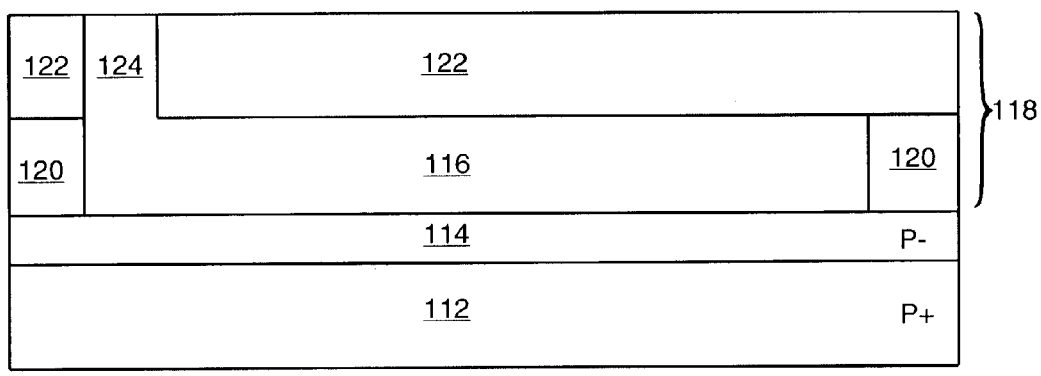

Referring now to FIG. 10D, next, a shallow counterdoping of region 122 of layer 118 to p-type doped to about 1e16 cm$^3$ is performed to serve as a vertical container for the red detector 116. Region 124 is masked from this doping step to provide access to the charge for the red detector 116. FIG. 10D shows the structure resulting after these processing steps have been performed.

Figure 10E:
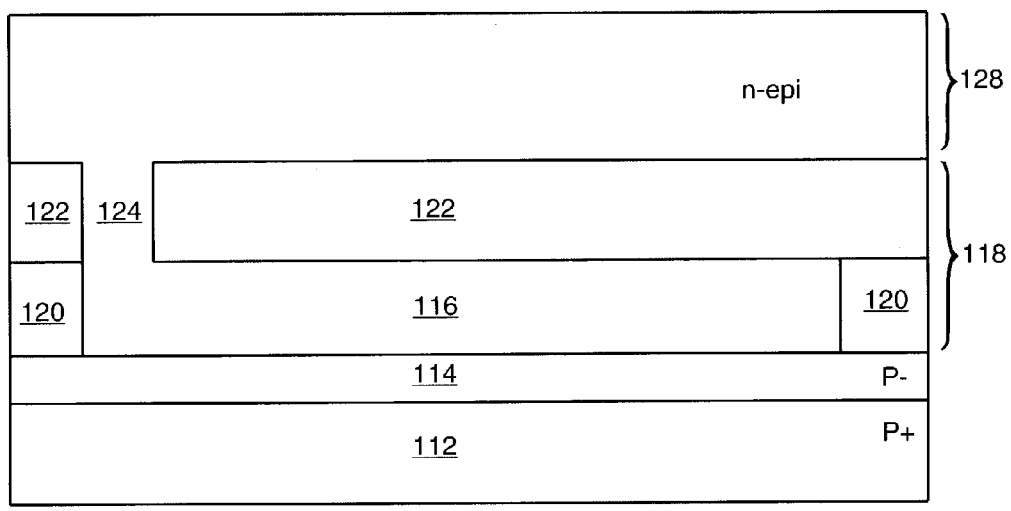

Referring now to FIG. 10E, an n-type layer 128 having a thickness of about 1 micron is then formed over the layer 118 and doped to a level of about 1e17 cm$^3$ by, for example, an epitaxial growth process. FIG. 10E shows the structure resulting after these processing steps have been performed.

Figure 10F:
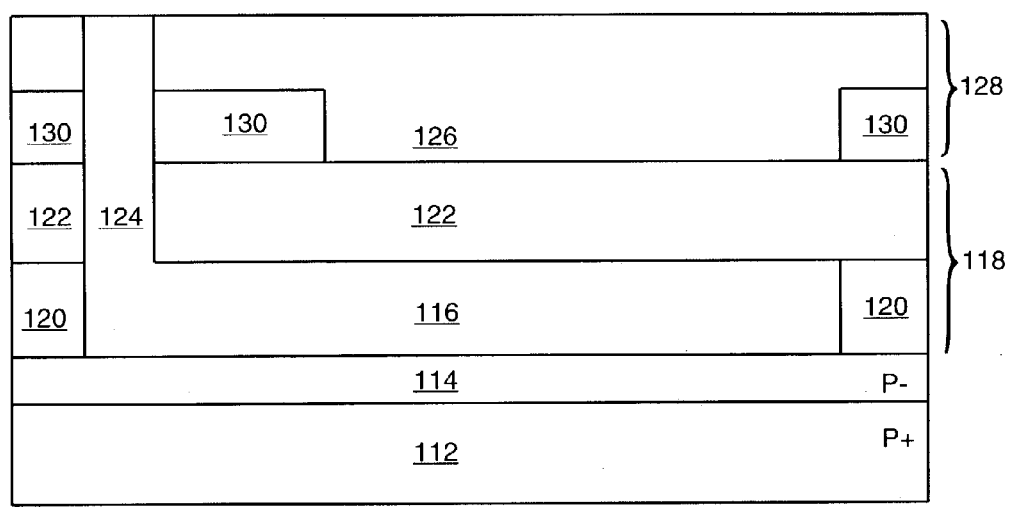

Referring now to FIG. 10F, a masked counterdoping deep implant is performed in layer 128 to form regions 130 therein doped to p-type at a level of about 1e17 cm$^3$ to form the lower lateral portions of a green charge container around green detector portion 126 and isolation from adjacent detector structures. FIG. 10F shows the structure resulting after these processing steps have been performed.

Figure 10G:
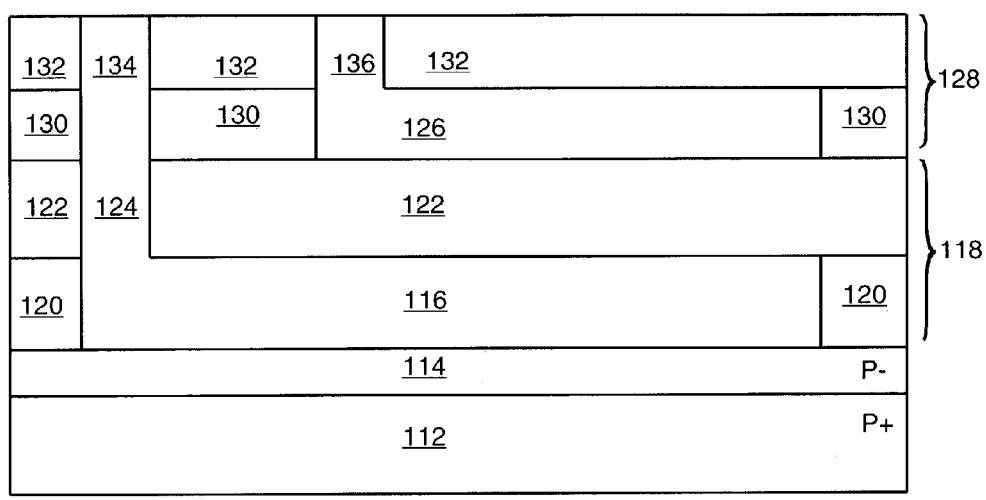

Referring now to FIG. 10G, a second masked counter-doping implant is performed on layer 128 to p-type at a level of about 1e17 cm$^3$ to form region 132 to serve as the vertical portion of the green charge container for green detector 126 except in regions 134 and 136 to allow access to the red and green collectors 116 and 126. FIG. 10G shows the structure resulting after these processing steps have been performed.

Figure 10H:
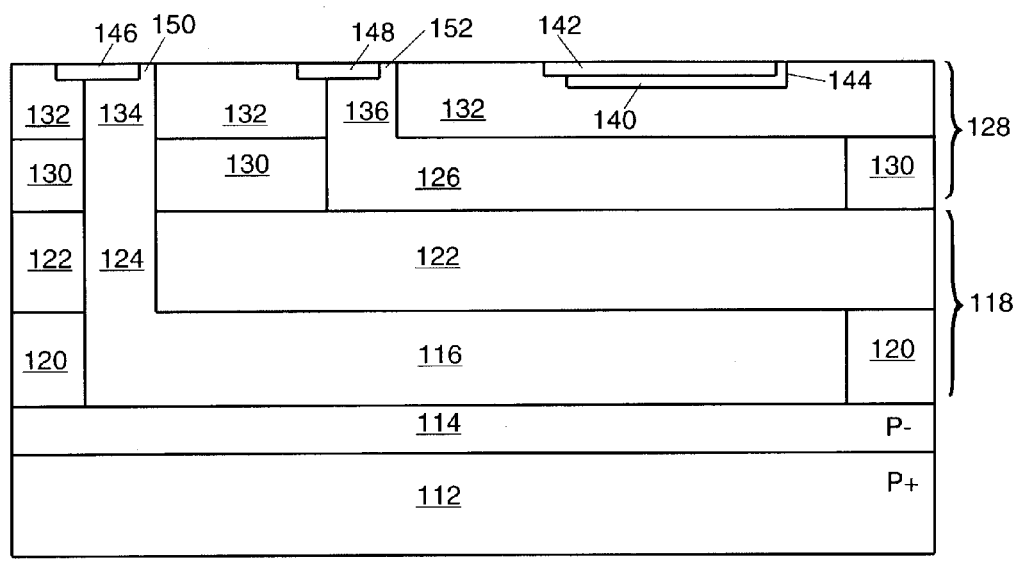

Referring now to FIG. 10H, an n-type buried implant is performed in region 132 of layer 128 to form blue detector 140. Next, p+ surface passivation layer 142 is formed by a masked implant that leaves only a small region 144 of the blue detector 140 exposed at the surface of region 132. Similar p+ passivation layers 146 and 148, which may be formed using the same mask as that used for passivation layer 142, are formed in n-type regions 134 and 136, exposing only small portions 150 and 152, respectively, of n-type regions 134 and 136 at their surfaces. FIG. 10H shows the structure resulting after these processing steps have been performed.

Figure 10I:
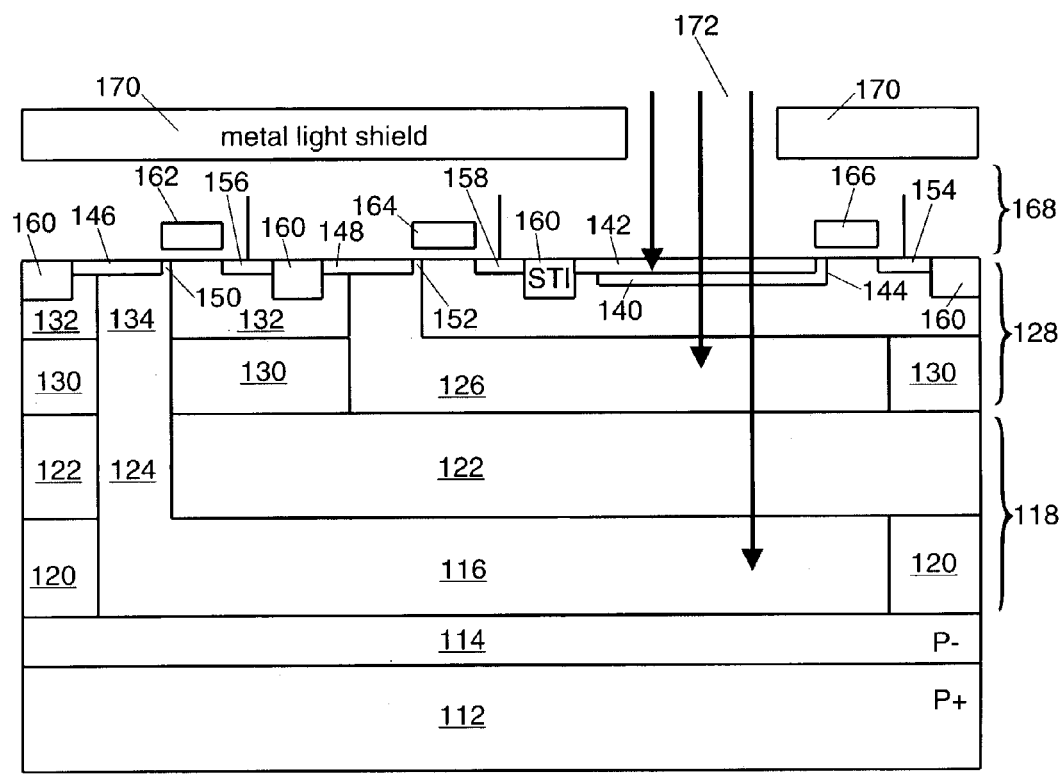

Referring now to FIG. 10I, shallow trench-isolation regions 160 are formed using known trench-isolation techniques. N-type surface regions identified by reference numerals 154, 156, and 158 are implanted to form the sense nodes for the outputs of the three colors. A gate oxide layer is formed over the surface of the structure and barrier gates 162, 164, and 166, are formed over and insulated from layer 132. Barrier gates 162, 164, and 166 are aligned, respectively, between the small regions 144, 150 and 152, and n-type sense-node regions 154, 156, and 158 in layer 132. A passivation layer 168 is formed over the gates and a light shield 170 is formed thereover. Light shield 170 has an aperture 172 formed therein to allow light to pass only to the desired detector regions of the structure. FIG. 10I shows the structure resulting after these processing steps have been performed.

Figure 11:
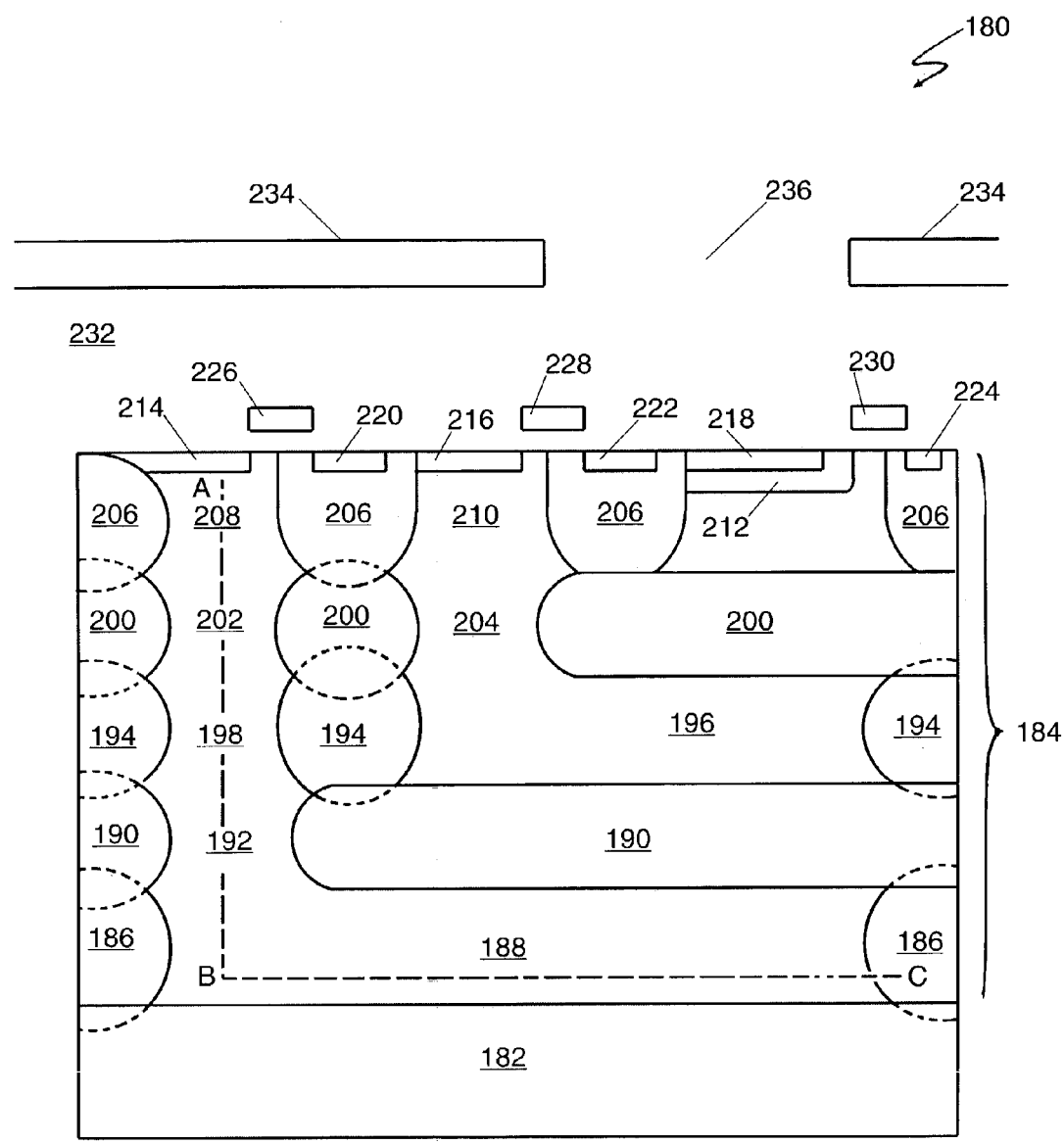
FIG. 11 is a semiconductor cross sectional diagram of another illustrative complete-charge-transfer vertical-color-filter detector group according to the invention.

Referring now to FIG. 11, a diagram shows in cross-sectional view another illustrative and non-limiting example of a complete-charge-transfer vertical-color-filter detector group 180 that may be used to practice the present invention. Complete-charge-transfer vertical-color-filter detector group 180 is formed on a p-type semiconductor substrate 182. In an illustrative embodiment, substrate 182 may be doped to a concentration of about 1e18 cm$^3$.

An n-type epitaxial layer 184 is formed over substrate 182. In an illustrative embodiment, n-type epitaxial layer 184 may be formed to a thickness of about 6 microns. As n-type epitaxial layer 184 is formed, the concentration of n-type dopant fed into the reactor is gradually increased throughout the growth cycle. This results in a structure wherein the dopant concentration gradually and monotonically increases as a function of vertical location in n-type epitaxial layer 184 from a concentration of about 1e16 cm$^3$ at the bottom of n-type epitaxial layer 184 to a concentration of about 1e17 cm$^3$ n-type at the top of epitaxial layer 184.

A deep p-type masked implant is performed to form p-type regions 186 at the left and right edges of the bottom of n-type epitaxial layer 184. Regions 186 form the lateral boundaries of a red detector located at region 188 of n-type epitaxial layer 184. Next, another shallower p-type masked implant is performed to form p-type regions 190 in n-type epitaxial layer 184. Regions 190 form the upper vertical boundary of the red detector 188 and region 192, masked off from this implant, forms a part of the red channel for extracting the photocharge from the red detector.

Another shallower p-type masked implant is performed to form p-type regions 194 in n-type epitaxial layer 184 above p-type regions 190. The center and rightmost regions 194, form the lateral boundary of a green detector 196 in n-type epitaxial layer 184. The leftmost and center regions 194 define a portion 198 of the red channel for extracting the photocharge from the red detector.

Another shallower p-type masked implant is performed to form p-type regions 200 in n-type epitaxial layer 184 above p-type regions 194. The center and rightmost regions 194 form the vertical boundary of the green detector 196 in n-type epitaxial layer 184. The leftmost and center regions 200 define a portion 202 of the red channel for extracting the photocharge from the red detector and a portion 204 of the green channel for extracting the photocharge from the green detector.

A surface masked implant 206 is performed to form p-type regions 206 in n-type epitaxial layer 184 above p-type regions 200. The two rightmost regions 206 form a container for the blue detector in n-type epitaxial layer 184. The two leftmost regions 206 define a portion 208 of the red channel for extracting the photocharge from the red detector. The two centermost regions 206 define a portion 210 of the green channel for extracting the photocharge from the green detector.

A masked implant is performed in n-type epitaxial layer 184 to form n+ region 212 to serve as the blue detector. A masked implant is performed to form p-type passivation regions 214, 216, and 218 in regions 208, 210, and 212 of n-type epitaxial layer 184. N-type regions 220, 222, and 224 are formed in p-type regions 206 to form sense nodes for the red, green, and blue detectors. Barrier gates 226, 228, and 230 are formed over a gate dielectric on the surface of n-type epitaxial layer 184.

A passivation layer 232 is formed over the structure and a light shield 234 is disposed over the structure and has an aperture 236 formed therein to allow light to pass into the structure only in the desired detector regions.

The entire area on the substrate 182 over which the aforementioned layers are formed will comprise the area of an array of vertical-color-filter detector groups 180. The regions 186, 190, 194, 200, and 206 provide lateral inter-group detector isolation. Persons of ordinary skill in the art will appreciate that other portions of the regions 186, 190, 194, 200, and 206 necessary to define the entire lateral periphery of the vertical-color-filter detector group 180 are disposed behind and in front of the plane of the figure and thus are not seen in the figure. Inter-group spacing of the complete-charge-transfer vertical-color-filter detector groups of the present invention may be on the order of about 5 microns.

Figure 12A:
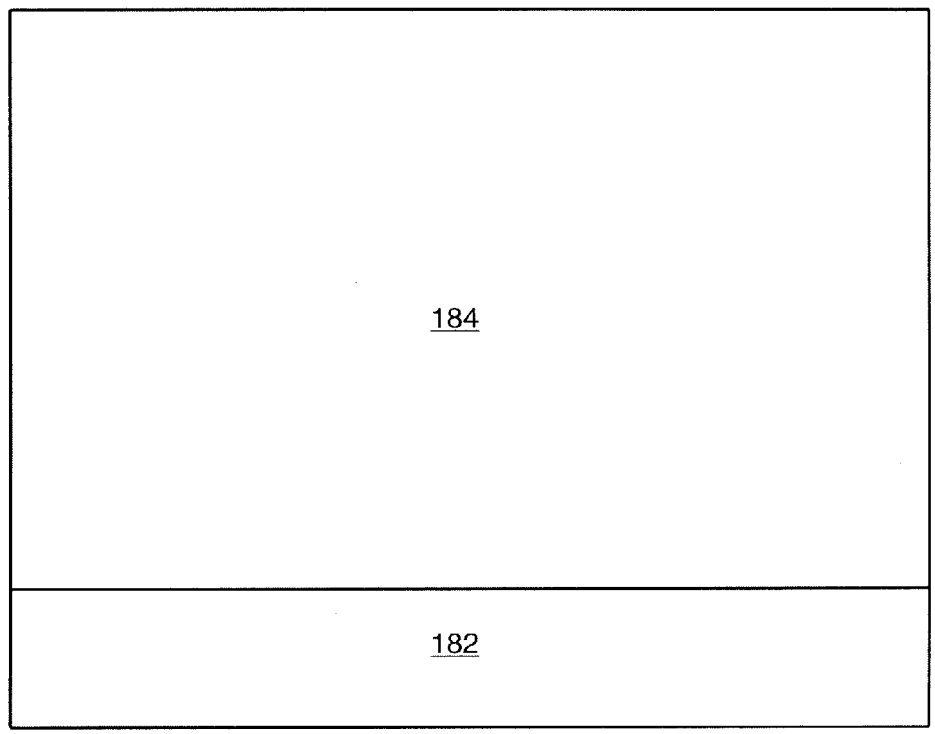
FIGS. 12A through 12E are cross-sectional diagrams showing the structure resulting after completion of selected steps in another fabrication process for a complete-charge-transfer vertical-color-filter detector group of FIG. 11 according to the present invention.

Referring now to FIGS. 12A through 12E, an illustrative semiconductor fabrication process for fabricating the complete-charge-transfer vertical-color-filter detector group of FIG. 11 is shown. Referring first to FIG. 12A, the process starts with a p-type semiconductor substrate 180. In an illustrative embodiment, substrate 180 may be doped to a concentration of about $1e18$ $cm^3$. Next, an n-type layer 182 is formed over substrate 180 to a thickness of about 6 microns, using a technique such as epitaxial deposition. Control is exerted over the amount of dopant introduced into the reactor as the epitaxial growth proceeds such that the concentration of n-type dopant fed into the reactor is gradually increased throughout the growth cycle. This results in a structure wherein the dopant concentration gradually and monotonically increases as a function of vertical location in n-type epitaxial layer 184 from a concentration of about $1e16$ $cm^3$ at the bottom of n-type epitaxial layer 184 to a concentration of about $1e17$ $cm^3$ n-type at the top of epitaxial layer 184. FIG. 12A shows the structure resulting after these processing steps have been performed.

Figure 12B:
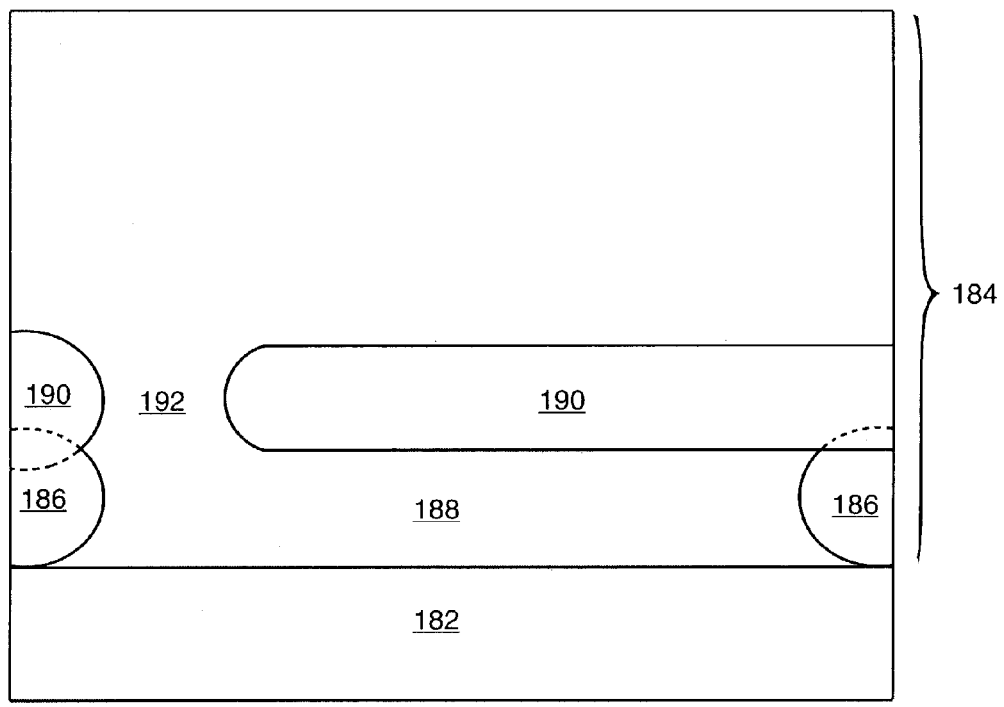

Referring now to FIG. 12B, a deep p-type masked implant is performed to form p-type regions 186 at the left and right edges of the bottom of n-type epitaxial layer 184. Regions 186 form the lateral boundaries of a red detector located at region 188 of n-type epitaxial layer 184. Next, another shallower p-type masked implant is performed to form p-type regions 190 in n-type epitaxial layer 184. Regions 190 form the upper vertical boundary of the red detector 188 and region 192, masked off from this implant, forms a part of the red channel for extracting the photocharge from the red detector. FIG. 12B shows the structure resulting after these processing steps have been performed.

Figure 12C:
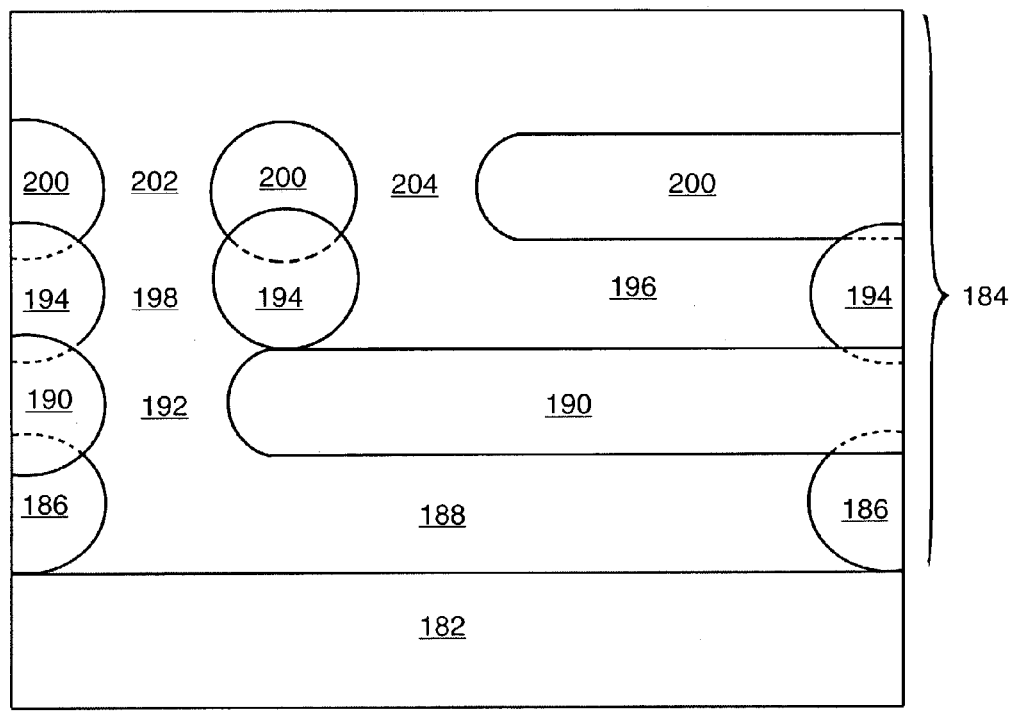

Referring now to FIG. 12C, another shallower p-type masked implant is performed to form p-type regions 194 in n-type epitaxial layer 184 above p-type regions 190. The center and rightmost regions 194 form the lateral boundary of a green detector 196 in n-type epitaxial layer 184. The leftmost and center regions 194 define a portion 198 of the red channel for extracting the photocharge from the red detector. Another shallower p-type masked implant is performed to form p-type regions 200 in n-type epitaxial layer 184 above p-type regions 194. The center and rightmost regions 194 form the vertical boundary of the green detector 196 in n-type epitaxial layer 184. The leftmost and center regions 200 define a portion 202 of the red channel for extracting the photocharge from the red detector and a portion 204 of the green channel for extracting the photocharge from the green detector. FIG. 12C shows the structure resulting after these processing steps have been performed.

Figure 12D:
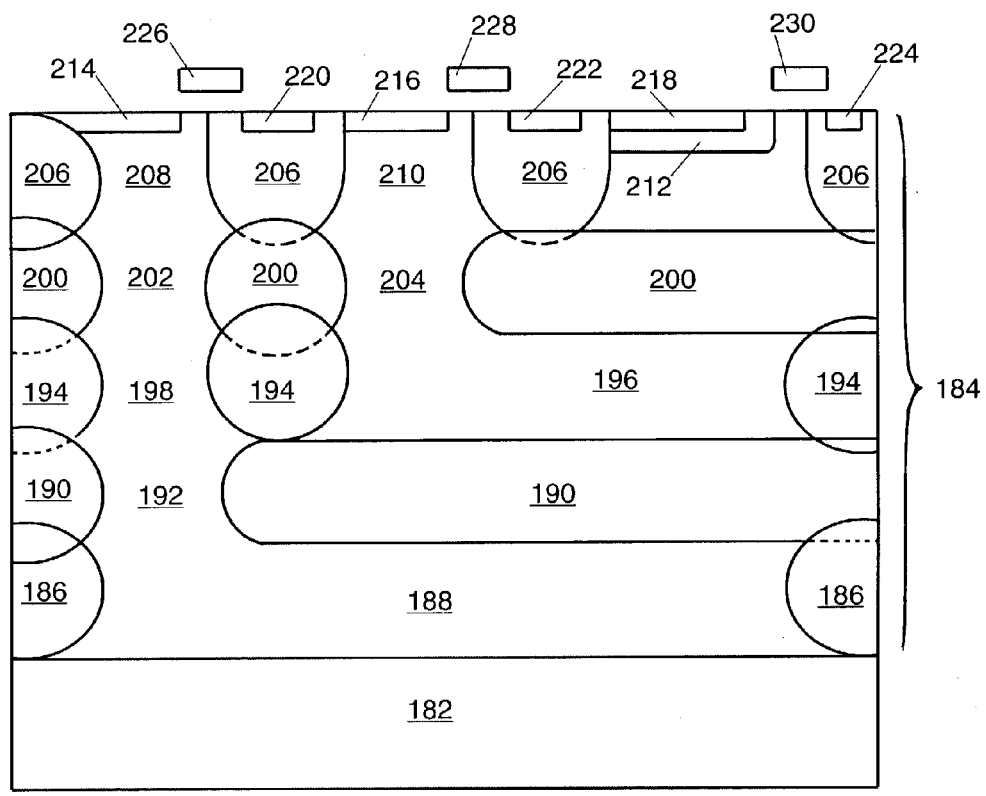

Referring now to FIG. 12D, a surface masked implant 206 is performed to form p-type regions 206 in n-type epitaxial layer 184 above p-type regions 200. The two rightmost regions 206 form a container for the blue detector in n-type epitaxial layer 184. The two leftmost regions 206 define a portion 208 of the red channel for extracting the photocharge from the red detector. The two centermost regions 206 define a portion 210 of the green channel for extracting the photocharge from the green detector.

A masked implant is performed in n-type epitaxial layer 184 to form n+ region 212 to serve as the blue detector. A masked implant is performed to form p-type passivation regions 214, 216, and 218 in regions 208, 210, and 212 of n-type epitaxial layer 184. N-type regions 220, 222, and 224 are formed in p-type regions 206 to form sense nodes for the red, green, and blue detectors. Barrier gates 226, 228, and 230 are formed over a gate dielectric on the surface of n-type epitaxial layer 184. FIG. 12D shows the structure resulting after these processing steps have been performed.

Figure 12E:
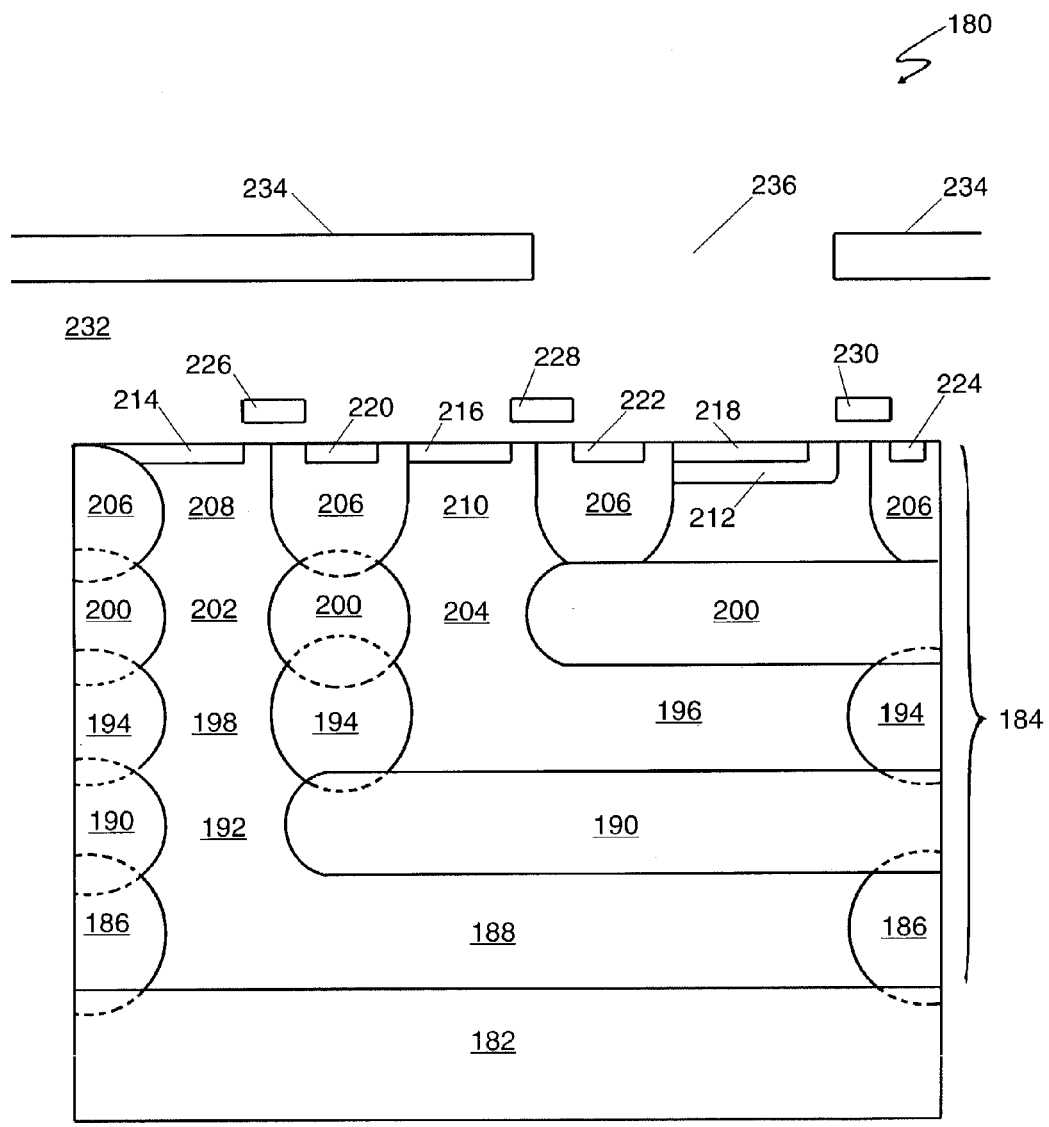

Referring now to FIG. 12E, a passivation layer 232 is formed over the structure and a light shield 234 is disposed over the structure and has an aperture 236 formed therein to allow light to pass into the structure only in the desired detector regions. FIG. 12E shows the structure resulting after these processing steps have been performed.

There are conceptual similarities in the embodiments of the present invention shown in FIGS. 7 and 9 and 11 in that the red and green detectors are formed as potential wells within charge containers. In the case of the embodiment of FIG. 7, the potential wells are formed as a consequence of the doping differential between the charge containers for the red and green detectors and the detectors themselves. In the embodiments of FIGS. 9 and 11, the potential wells are formed as a consequence of the junctions between the charge containers for the red and green detectors and the detectors themselves. In all of the embodiments illustrated herein, the doping densities along the vertical paths from the red and green detectors and the surface regions from which the charge representing the red and green signal levels is collected is a monotonic function; that is, while the doping-density-vs-vertical-height function may be a step function, it is monotonic in that the p-type dopant density is always decreasing, the n-type doping density is always increasing, and that there are no potential wells along these paths to trap charge. This principle applies also to embodiments of the present invention in which the semiconductor transports charge by holes instead of electrons and analogously employs doping gradients for charge transport and isolation.

Figure 13A:
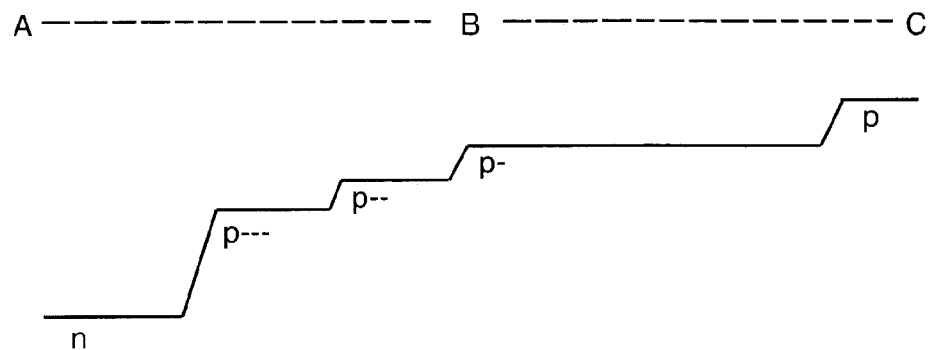
FIGS. 13A through 13C are graphs illustrating the doping-density profile of the vertical-color-filter detector group of FIG. 7 as a function of position.

Referring now to FIG. 13A, this electron-potential profile of the embodiment of FIG. 7 is illustrated, both as a function of depth in the silicon and as a function of lateral position in the red detector as a result of the doping-density gradient disclosed herein. The first portion of the potential profile between the points marked "A" and "B" in FIG. 13A corresponds to the doping-density of the silicon as a function of depth, wherein "A" and "B" in FIG. 13A correspond to the vertical portion between the corresponding points "A" and "B" of the dashed line in FIG. 7. FIG. 13A shows the potential shift resulting from the transition between n-type silicon through the three increased-doping levels of p-type silicon in the red charge container. The second portion of the potential profile between the points marked "B" and "C" of FIG. 13A corresponds to the doping-density of the silicon as a function of lateral position within the red detector 48 and the isolation region 46, wherein "B" and "C" in FIG. 13A correspond to the horizontal portion between the corresponding points "B" and "C" of the dashed line in FIG. 7. This portion of the profile shows the potential barrier presented by the isolation region 46.

Figure 13B:
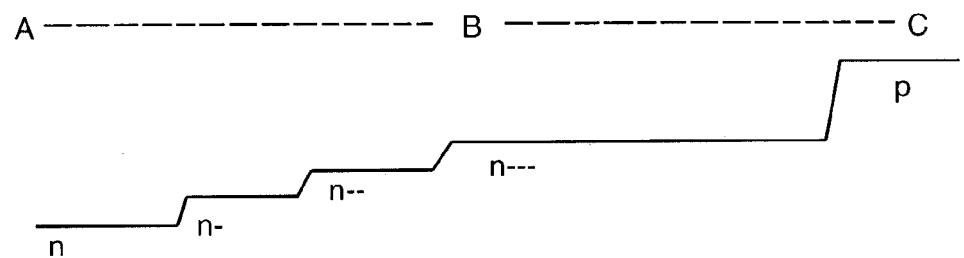

Referring now to FIG. 13B, this potential profile of the embodiment of FIG. 9 is illustrated, both as a function of depth in the silicon and as a function of lateral position in the red detector as a result of the doping-density gradient disclosed herein. The first portion of the potential profile between the points marked "A" and "B" on FIG. 13B corresponds to the doping-density of the silicon as a function of depth, wherein "A" and "B" of FIG. 13B correspond to the vertical portion between the corresponding points "A" and "B" of the dashed line in FIG. 9. The second portion of the doping-density profile between the points marked "B" and "C" of FIG. 13B corresponds to the doping-density of the silicon as a function of lateral position within the red detector 110 and the isolation region 106, wherein "B" and "C" of FIG. 13B correspond to the horizontal portion between the corresponding points "B" and "C" of the dashed line in FIG. 9.

Figure 13C:
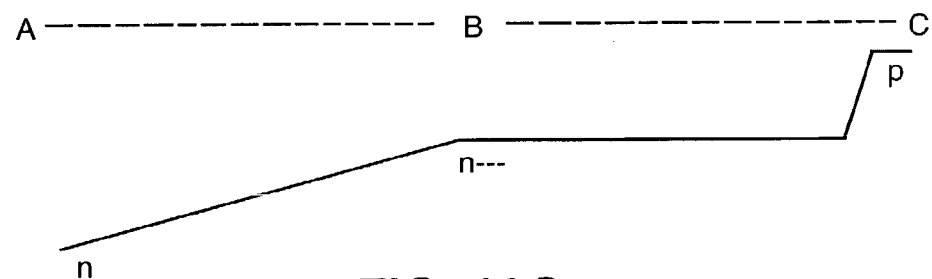

Referring now to FIG. 13C, this doping-density profile of the embodiment of FIG. 11 is illustrated, both as a function of depth in the silicon and as a function of lateral position in the red detector. The first portion of the doping-density profile between the points marked "A" and "B" in FIG. 13C corresponds to the doping-density of the silicon as a function of depth, wherein "A" and "B" in FIG. 13C correspond to the vertical portion between the corresponding points "A" and "B" of the dashed line in FIG. 11. The second portion of the potential profile between the points marked "B" and "C" of FIG. 13C corresponds to the doping-density of the silicon as a function of lateral position within the red detector 48 and the isolation region 46, wherein "B" and "C" of FIG. 13C correspond to the horizontal portion between the corresponding points "B" and "C" of the dashed line in FIG. 11.

The processes employed for fabricating the vertical filter sensor group of the present invention are compatible with standard CMOS processes. The additional process steps needed for the creation of these structures are all performed prior to the standard CMOS steps, thus minimizing interactions.

The masking, implanting, drive-in and anneal, epitaxial growth, and other fabrication process steps described above for fabricating the novel structure disclosed herein are individually well known to persons of ordinary skill in semiconductor processing art for fabricating other semiconductor devices. Process parameters, such as times, temperatures, reactant species, etc. will vary between individual processes but are known for use in such processes by persons skilled in the art. Such details will not be recited herein to avoid overcomplicating the disclosure and thus obscuring the invention.

The fabrication process disclosed herein provides several advantages. There are no large lateral diffusions associated with implant and drive wells, resulting in a smaller detector area.

Figure 14:
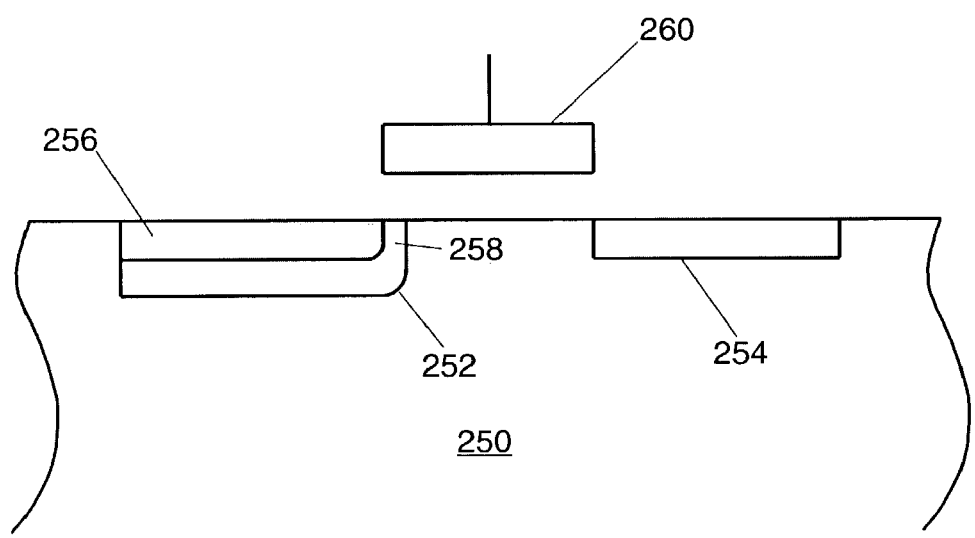
FIG. 14 is a cross-sectional view of a pinned-diode barrier gate device useful for extracting charge from the complete-charge-transfer vertical-color-filter detector groups of the present invention.

Referring now to FIG. 14, a cross-sectional view is shown of a pinned-diode barrier gate device useful for extracting charge from the complete-charge-transfer vertical-color-filter detector groups of the present invention. Persons of ordinary skill in the art will recognize this structure from FIG. 7 and its accompanying description and will understand the operation of these devices as shown, for example, in B. C. Burkey et al., "The Pinned Photodiode For an Interline-Transfer CCD Image Sensor" 1984 IEDM, San Francisco, Calif., Dec. 9–12, 1984 pp. 28–31.

The device is formed on a p-type substrate 250 that, in the context of the present invention, may comprise the surface p-type layer of the complete-charge-transfer vertical-color-filter detector group illustrated in any of FIGS. 7, 9, or 11. Spaced-apart n-type regions 252 and 254 are disposed in substrate 250. A p– surface passivation region 256 is disposed over n– region 252 leaving a small region 258 of n-type region 252. A gate-dielectric separates the surface of the p– passivation region 256, the small portion 258 of n-type region 252, and the n– region 254 from a polysilicon gate 260 that is aligned with the edge of p– passivation region 256 and its underlying n– region 252.

In some embodiments of the present invention, the device of FIG. 14 is used to extract the charge from all of the color channels. In other embodiments of the present invention, the device of FIG. 14 may be used to extract the charge from the green channel. The signals are taken from the red and green channels using MOS transistors such as N-channel MOS transistors to extract the signals as voltages.

Figure 15:
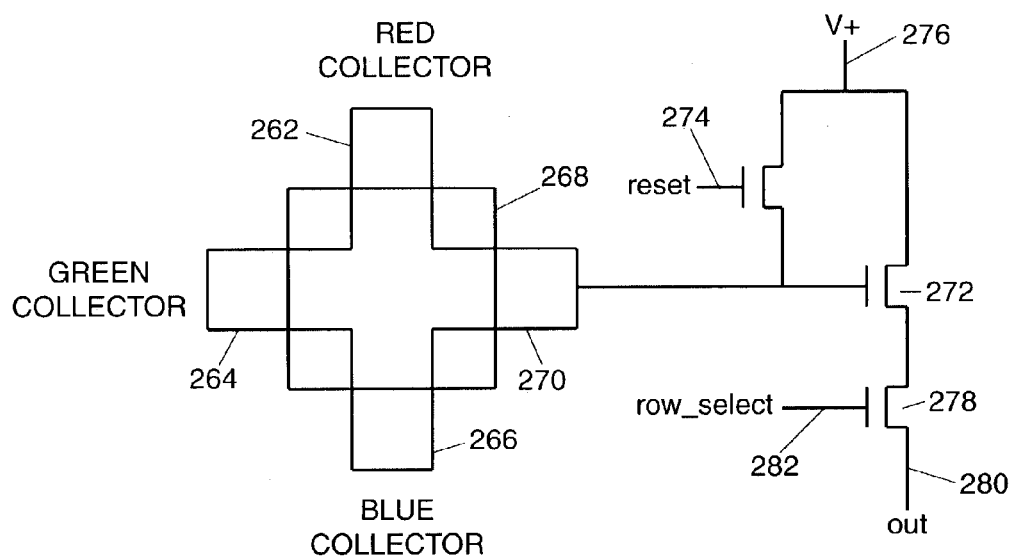
FIG. 15 is a top view of a portion of an illustrative integrated circuit layout employing three barrier gate devices of the type shown in FIG. 12 along with a schematic diagram illustrating other devices used in the complete-charge-transfer vertical-color-filter detector group of the present invention.

Referring now to FIG. 15, a top view shows a portion of an illustrative integrated circuit layout employing three barrier gate devices of the type shown in FIG. 14 along with a schematic diagram illustrating additional devices used in the complete-charge-transfer vertical-color-filter detector group of the present invention. Persons of ordinary skill in the art will appreciate that this is merely one illustrative embodiment among many possible, but equivalent layouts for these devices.

In the charge-transfer scheme illustrated in FIG. 15, the contact for the red detector is shown at reference numeral 262, the contact for the green detector is shown at reference numeral 264, and the sense node for the blue detector is shown at reference numeral 266. A common barrier gate 268 is used for all three of the devices. An output sense node is shown at reference numeral 270.

The common sense node 270 is coupled to the gate of a source-follower amplifier transistor 272 and to the source of reset transistor 274. The drains of source-follower transistor 272 and reset transistor 274 are coupled to a voltage source 276. The source of source-follower transistor 272 is coupled to the drain of row-select transistor 278. The source of row-select transistor 278 is coupled to a row line 280 and its gate is coupled to a row-select line 282.

Referring now to FIGS. 16A through 16F, potential diagrams illustrate how the barrier gate device such as those depicted in FIG. 14 could be used to transfer the charge from all three detectors of the complete-charge-transfer vertical-color-filter detector group of the present invention. FIGS. 16A through 16F each show the potentials of each of the contacts for the three (red, green, and blue) detectors and the potential at the barrier gate. FIGS. 16A through 16F show the relative timing and potentials applied to the circuit to transfer the charge representing the accumulated photons out of the red, green, and blue detectors. It is noted that, because negative charge is represented, lower vertical levels on the diagrams represent more positive voltage potentials.

Figures 16A, 16B:
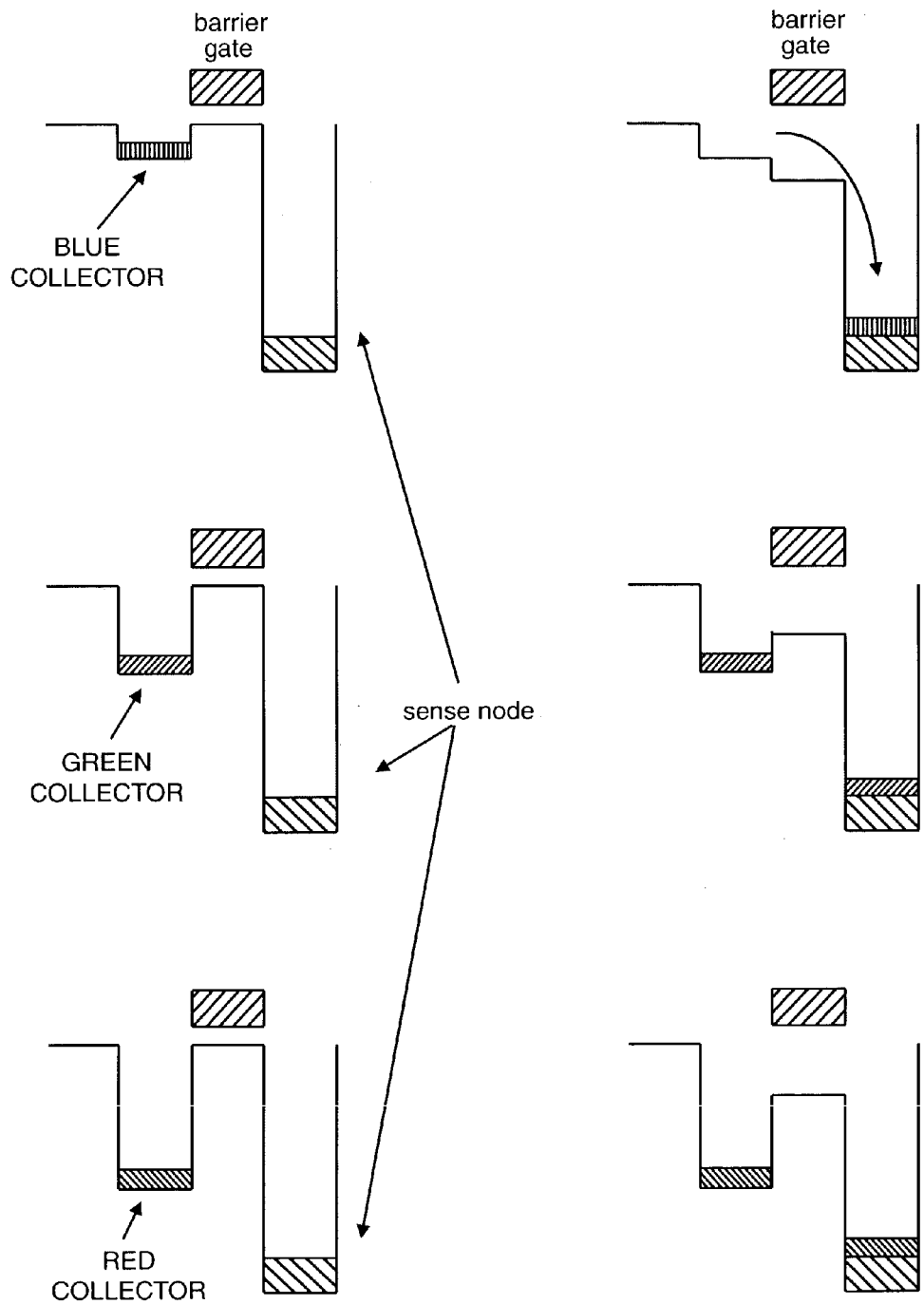

In each portion of FIGS. 16A through 16C, the left-hand portion of each diagram represents the potential at the detector. The right-hand portion of each diagram represents the potential at the sense node. The center portion of each diagram represents the potential at the barrier gate.

Referring first to FIG. 16A, the reset transistor 274 is turned on for a reset period to reset the common sense node to a reset potential related to the potential at voltage source 276 of FIG. 15. The potential at the barrier gate 268 is set to prevent the reset potential from disturbing the charge stored in the blue, green, and red channels.

Referring next to FIG. 16B, the reset transistor 274 is turned off and barrier gate 268 is set to a potential that transfers all of the charge in the blue collector to the sense node. The capacitance of the gate of source-follower transistor 272 converts this charge to a voltage. The voltage at the output of source-follower transistor 272 is transferred to the row line 280 when the row-select line 282 is activated to turn on row-select transistor 278. The row-select line is then deactivated to turn off row-select transistor 278.

Referring now to FIG. 16C, the reset transistor 274 is turned on for a reset period to again reset the sense nodes to a reset potential related to the potential at voltage source 276 of FIG. 15 while the potential at barrier gate 268 is again set to prevent the reset potential from disturbing the charge stored in the green and red channels. The reset transistor 274 is then turned off.

Referring next to FIG. 16D, barrier gate 268 is set to a potential that transfers all of the charge in the green collector to the sense node. The capacitance of the gate of source-follower transistor 272 converts this charge to a voltage. The voltage at the output of source-follower transistor 272 is transferred to the row line 280 when the row-select line 282 is activated to turn on row-select transistor 278. The row-select line is then deactivated to turn off row-select transistor 278.

Referring now to FIG. 16E, the reset transistor 274 is again turned on for a reset period to reset the sense nodes to a reset potential related to the potential at voltage source 276 of FIG. 15 while the potential at barrier gate 268 is set to prevent the reset potential from disturbing the charge stored in the red channel. The reset transistor 274 is then turned off.

Referring next to FIG. 16F, barrier gate 268 is set to a potential that transfers all of the charge in the red collector to the sense node. The capacitance of the gate of source-follower transistor 272 converts this charge to a voltage. The voltage at the output of source-follower transistor 272 is transferred to the row line 280 when the row-select line 282 is activated to turn on row-select transistor 278. The row-select line is then deactivated to turn off row-select transistor 278.

As may be seen from an examination of FIGS. 16A through 16F, the barrier gate potential necessary to transfer charge from the blue, green, and red detectors is successively larger. Persons of ordinary skill in the art will observe that, because overflow due to overexposure occurs through the barrier gate, the blue channel will overflow first, while the red channel continues to store additional charge. This should not degrade the image since most scenes have more red light than blue light. This overflow could be used to generate a signal to stop the integration period.

In embodiments where the three-connection, barrier-gate device of FIG. 15 is employed, the sense node reset voltage may be, for example, about 3V. A reasonable set of select-potential voltages for readout of the Blue, Green and Red charge collection regions may be about 1V, 1.5V and 2V respectively. For embodiments employing thin-gate dielectrics, the select-potential voltages on the three barrier gates may be about 1.3V, 1.8V and 2.3V respectively.

Persons of ordinary skill in the art will appreciate that, in embodiments that do not have a common barrier gate, all three colors could be read out simultaneously, at the cost of replicating the rest, source-follower, and row-select transistors.

Figure 17:
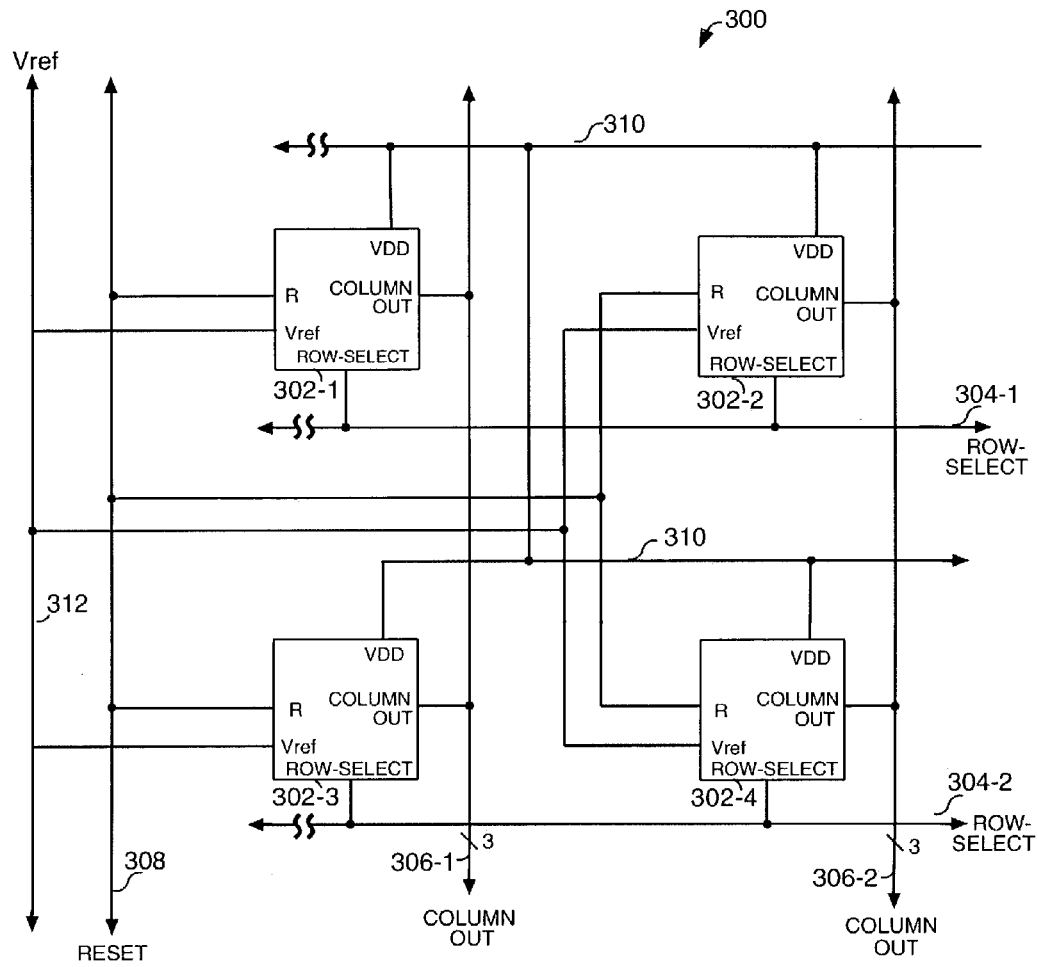
FIG. 17 is a block diagram of an exemplary array of complete-charge-transfer vertical-color-filter detector groups of the present invention.

Referring now to FIG. 17, a block diagram shows an exemplary array 300 of complete-charge-transfer vertical-color-filter detector groups of the present invention. Persons of ordinary skill in the art will observe that the array 300 depicted in FIG. 17 could be formed from any of the complete-charge-transfer vertical-color-filter detector groups of the present invention as shown in FIGS. 7, 9, or 11.

FIG. 17 shows an illustrative 2 by 2 portion of an array of complete-charge-transfer vertical-color-filter detector groups that may be used in accordance to the present invention. Persons of ordinary skill in the art will readily appreciate that the array portion disclosed in FIG. 17 is illustrative only and that arrays of arbitrary size may be fabricated using the teachings herein. The illustrative array example of FIG. 17 may employ a barrier-gate device such as the one depicted in FIGS. 14 and 15 and so includes a single charge-readout line serving the array. Persons of ordinary skill in the art will appreciate that arrays employing a barrier-gate device for reading the green channel and separate MOS transfer transistors for reading the red and blue channels are also contemplated as within the scope of the present invention and that such arrays will also include individual signal lines for driving the gates of those MOS transfer transistors.

Common RESET lines can be provided for all of the vertical-color-filter detector groups in the array. A single drain-voltage node is provided for the source-follower transistors. The source of the single row-select transistor for all three colors in a column of the array will be coupled to a single column line associated with that column and the gates of all row-select transistors for a row of the array will be coupled to a ROW-SELECT line associated with that row. As will be appreciated by persons of ordinary skill in the art, the color-output signals will be multiplexed onto the single column line by appropriately timing the readout signals as is known in the art.

The 2 by 2 portion 300 of the array in FIG. 17 includes two rows and two columns of vertical-color-filter detector groups. A first row includes vertical-color-filter detector groups 172-1 and 172-2; a second row includes vertical-color-filter detector groups 172-3 and 172-4. A first column includes vertical-color-filter detector groups 172-1, 172-3; a second column includes vertical-color-filter detector groups 172-2 and 172-4.

A first ROW-SELECT line 174-1 is connected to the row-select inputs (ROW-SELECT) of vertical-color-filter detector groups 172-1 and 172-2. A second ROW-SELECT line 174-2 is connected to the row-select inputs (ROW-SELECT) of vertical-color-filter detector groups 172-3 and 172-4. The first and second ROW-SELECT lines may be driven from a row decoder (not shown) as is well known in the art.

A first COLUMN-OUT line 176-1 is connected to the outputs of vertical-color-filter detector groups 172-1 and 172-3. A second COLUMN-OUT line 176-2 is connected to the outputs of vertical-color-filter detector groups 172-2 and 172-4. The first and second COLUMN-OUT lines are coupled to column readout circuits (not shown) as is well known in the art.

Persons of ordinary skill in the art will appreciate that a COLUMN-OUT bus containing a separate COLUMN-OUT line for each color signal could also be employed in the present invention. In such an embodiment, a separate row-select transistor, as well as a separate source-follower amplifier transistor would be provided for each color signal.

A global RESET line 178 is connected to the reset (R) inputs of all of the vertical-color-filter detector groups 172-1 through 172-4. A global drain-voltage line 180 for the source-follower transistors is connected to the drain-voltage inputs of the all of the vertical-color-filter detector groups 172-1 through 172-4 in the array.

A global $V_{ref}$ line 184 to provide a reset potential is connected to the $V_{ref}$ inputs of all of the vertical-color-filter detector groups 172-1 through 172-4. Alternately, multiple $V_{ref}$ lines (e.g., one for each column) could be provided.

Figure 18:
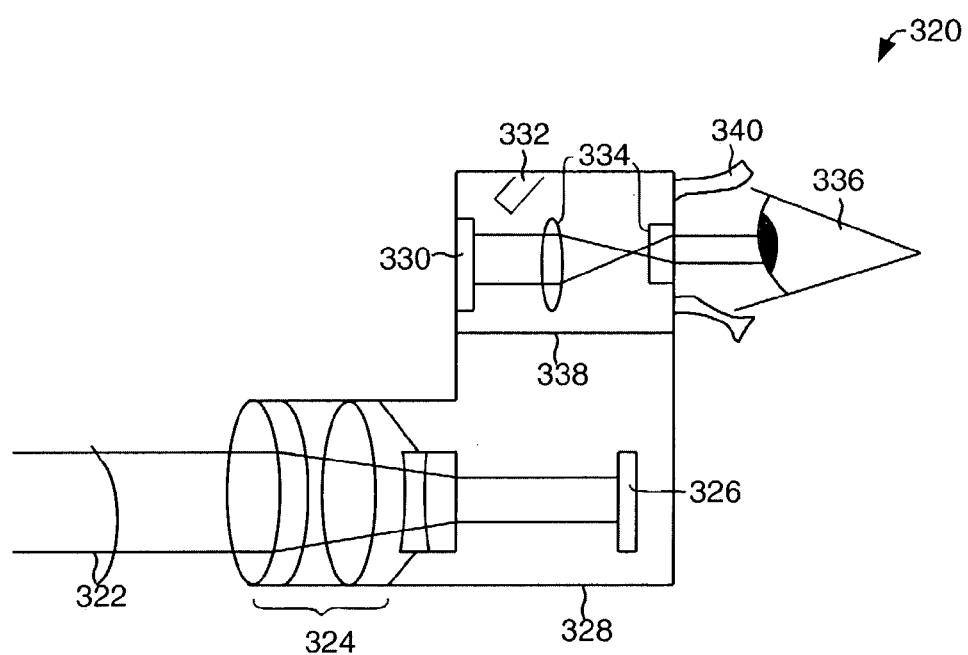
FIG. 18 is a block diagram of an illustrative embodiment of an image-capture-and-display system in accordance with this invention.

Referring now to FIG. 18 a block diagram shows an illustrative embodiment of an image capture and display system 210 in accordance with this invention. Rays of light 212 from a scene to the left of the figure are focused by primary optical system 214 onto a sensor chip 216 containing an array of active vertical-color-filter detector groups according to the present invention. Optical system 214 and sensor chip 216 are housed within light-tight housing 218 to prevent stray light from falling on sensor chip 216 and thereby corrupting the image formed by rays 212. In an illustrative embodiment, the image-capture-and-display system 210 may optionally include an electronic system, not illustrated in FIG. 18, to take electrical signals from sensor chip 216 and drive electrical signals suitable for driving display chip 220, which can be either of the micro-machined reflective type as supplied by Texas Instruments, or of the liquid-crystal coated type, as supplied by micro-display vendors such as Kopin, MicroDisplay Corp. or Inviso.

Display chip 220 is illuminated by light-emitting-diode (LED) array 222. Reflected light from display chip 220 is focused by secondary optical system 224 in such a manner that images can be viewed by the eye 226 of the user of the camera. Alternatively, display chip 210 can be an organic light-emitting array, in which it produces light directly and does not require LED array 222. Both technologies give bright displays with excellent color saturation and consume very little power, thus being suitable for integration into a compact camera housing as illustrated in FIG. 9. A light-tight baffle 228 separates the chamber housing sensor chip 216 from that housing LED array 222, display chip 220, and secondary optical system 224. Viewing the image from display chip 220 in bright sunlight is made easier by providing rubber or elastomer eye cup 230.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A vertical-color-filter detector disposed in a semiconductor structure comprising:
   a complete-charge-transfer detector comprising semiconductor material doped to a first conductivity type and having a horizontal portion disposed at a first depth in the semiconductor structure substantially below an upper surface thereof, said complete-charge-transfer detector having a vertical portion, said complete-charge-transfer detector disposed within a first charge container forming a potential well around said complete-charge-transfer detector, said horizontal portion of said complete-charge-transfer detector having a substantially uniform doping density in a substantially horizontal direction and said vertical portion of said complete-charge-transfer detector having a doping density that is a monotonic function of depth and being devoid of potential wells; and
   a first charge-transfer device disposed substantially at an upper surface of said semiconductor structure and coupled to said vertical portion of said complete-charge-transfer detector.

2. The vertical-color-filter detector of claim 1 wherein said first charge container comprises semiconductor material of said first conductivity type doped to a level higher than that of said complete-charge-transfer detector.

3. The vertical-color-filter detector of claim 1 wherein said first, charge container comprises semiconductor material of said first conductivity type and said first complete-charge-transfer detector comprises semiconductor material of a second conductivity opposite that of said first conductivity type.

4. The vertical-color-filter detector of claim 1 wherein said first charge-transfer device comprises an integrated mechanical switch device.

5. The vertical-color-filter detector of claim 1 wherein said first charge-transfer device comprises a MOS switching device.

6. The vertical-color-filter detector of claim 1 further including:
   a reset transistor having a source coupled to said first charge-transfer device, a drain coupled to a reset-potential node, and a gate coupled to a reset signal source;
   a source-follower transistor having a gate coupled to said first charge-transfer device, a drain coupled to a source-follower-drain-potential node, and a source; and
   an output transistor having a drain coupled to said source of said source-follower transistor, a gate coupled to a row-select line, and a source coupled to a column-output line.

7. The vertical-color-filter detector of claim 6, configured in an array having at least two rows and at least two columns.

8. The vertical-color-filter detector of claim 1 further including:
   a first detector disposed in the semiconductor structure, said first detector having a horizontal portion disposed at a depth different from said depth of said horizontal portion of said at complete-charge-transfer detector, said first detector having a vertical portion, said first detector disposed within a second charge container forming a potential well around said first detector, and a second charge-transfer device disposed substantially at an upper surface of said semiconductor structure and coupled to said vertical portion of said first detector.

9. The vertical-color-filter detector of claim 8 further including:

a second detector disposed in the semiconductor structure, said second detector having a horizontal portion disposed at a depth different from said depth of said horizontal portion of said at complete-charge-transfer detector and from the depth of said horizontal portion of said first detector, said second detector having a vertical portion, said second detector disposed within a third charge container forming a potential well around said second detector, and a third charge-transfer device disposed substantially at an upper surface of said semiconductor structure and coupled to said vertical portion of said second detector.

10. The vertical-color-filter detector of claim 9 wherein said depth of said horizontal portion of said first detector is greater than said depth of said horizontal portion of said complete-charge-transfer detector and said depth of said horizontal portion of said second detector is less than said depth of said horizontal portion of said complete-charge-transfer detector.

11. The vertical-color-filter detector of claim 9 wherein said first, second, and third charge containers comprise semiconductor material of said first conductivity type doped to a level higher than that of said complete-charge-transfer detector and said first and second detectors.

12. The vertical-color-filter detector of claim 9 wherein said first, second, and third charge containers each comprise semiconductor material of said first conductivity type and said complete-charge-transfer detector and said first and second detectors each comprise semiconductor material of a second conductivity opposite that of said first conductivity type.

13. The vertical-color-filter detector of claim 9 wherein said first, second, and third charge-transfer devices each comprise an integrated mechanical switch device.

14. The vertical-color-filter detector of claim 9 wherein said first, second, and third charge-transfer devices each comprise a MOS switching device.

15. The vertical-color-filter detector of claim 9 wherein said first, second, and third charge-transfer devices comprise a MOS switching device having a single sense node coupleable to a collection point for photocharge from said first detector, to a collection point for photocharge from said second detector and to a collection point for photocharge from third detector by a common barrier gate.

16. The vertical-color-filter detector of claim 15 further including:

a reset transistor having a source coupled to said sense node, a drain coupled to a reset-potential node, and a gate coupled to a reset signal source;

a source-follower transistor having a gate coupled to said sense node, a drain coupled to a source-follower-drain-potential node, and a source; and an output transistor having a drain coupled to said source of said source-follower transistor, a gate coupled to a row-select line, and a source coupled to a column-output line.

17. The vertical-color-filter detector of claim 16, configured in an array having at least two rows and at least two columns.

18. A complete-charge-transfer vertical-color-filter detector group disposed in a semiconductor structure comprising:

a first detector comprising semiconductor material doped to a first conductivity type and having a horizontal portion disposed at a first depth in the semiconductor structure, said first detector having a vertical portion, said first detector disposed within a first charge container forming a potential well around said first detector, said horizontal portion of said first detector having a substantially uniform doping density in a substantially horizontal direction and said vertical portion of said first detector having a doping density that is a monotonic function of depth and being devoid of potential wells;

a second detector comprising semiconductor material doped to said first conductivity type, said second detector having a horizontal portion substantially vertically aligned with said horizontal portion of said first detector and disposed at a second depth in said semiconductor structure shallower than said first depth, said second detector having a vertical portion, said second detector disposed within a second charge container forming a potential well around said second detector, said horizontal portion of said second detector having a substantially uniform doping density in a substantially horizontal direction and said vertical portion of said second detector having a doping density that is a monotonic function of depth and being devoid of potential wells;

a third detector comprising semiconductor material doped to a first conductivity type, said third detector having a horizontal portion substantially vertically aligned with said horizontal portion of said first detector and disposed at a third depth in said semiconductor structure shallower than said second depth, said third detector having a vertical portion, said third detector disposed within a third charge container forming a potential well around said third detector, said horizontal portion of said third detector having a substantially uniform doping density in a substantially horizontal direction and said vertical portion of said third detector having a doping density that is a monotonic function of depth and being devoid of potential wells;

a first charge-transfer device disposed substantially at an upper surface of said semiconductor structure and coupled to said vertical portion of said first detector;

a second charge-transfer device disposed substantially at an upper surface of said semiconductor structure and coupled to said vertical portion of said second detector; and a third charge-transfer device disposed substantially at an upper surface of said semiconductor structure and coupled to said vertical portion of said third detector.

19. The complete-charge-transfer vertical-color-filter detector group of claim 18 wherein said first, second, and third charge containers comprise semiconductor material of said first conductivity type doped to a level higher than that of said first, second, and third detectors.

20. The complete-charge-transfer vertical-color-filter detector group of claim 18 wherein said first, second, and third charge containers each comprise semiconductor material of said first conductivity type and said first, second, and third detectors each comprise semiconductor material of a second conductivity opposite that of said first conductivity type.

21. The complete-charge-transfer vertical-color-filter detector group of claim 18 wherein said first, second, and third charge-transfer devices each comprise an integrated mechanical switch device.

22. The complete-charge-transfer vertical-color-filter detector group of claim 18 wherein said first, second, and third charge-transfer devices each comprise a MOS switching device.

23. The complete-charge-transfer vertical-color-filter detector group of claim 18 wherein said first, second, and third charge-transfer devices comprise a MOS switching device having a single sense node coupleable to a collection point for photocharge from said first detector, to a collection point for photocharge from said second detector and to a collection point for photocharge from third detector by a common barrier gate.

24. The complete-charge-transfer vertical-color-filter detector group of claim 18 further including a light shield disposed over said semiconductor structure, said light shield having an aperture substantially vertically aligned with said horizontal portion of said first detector.

25. The complete-charge-transfer vertical-color-filter detector group of claim 23 further including:
a reset transistor having a source coupled to said sense node, a drain coupled to a reset-potential node, and a gate coupled to a reset signal source;
a source-follower transistor having a gate coupled to said sense node, a drain coupled to a source-follower-drain-potential node, and a source; and
an output transistor having a drain coupled to said source of said source-follower transistor, a gate coupled to a row-select line, and a source coupled to a column-output line.

26. The complete-charge-transfer vertical-color-filter detector group of claim 25, configured in an array having at least two rows and at least two columns.

27. A complete-charge-transfer vertical-color-filter detector group disposed in a semiconductor structure comprising:
a red detector comprising semiconductor material doped to a first conductivity type and having a horizontal portion disposed at a first depth below an upper surface of the semiconductor structure in the semiconductor structure selected to maximize absorption of red photons, said red detector having a vertical portion, said red detector disposed within a first charge container forming a potential well around said red detector, said horizontal portion of said red detector having a substantially uniform doping density in a substantially horizontal direction and said vertical portion of said red detector having a doping density that is decreasing as a monotonic function of depth towards said upper surface and being devoid of potential wells;
a green detector comprising semiconductor material doped to said first conductivity type, said green detector having a horizontal portion substantially vertically aligned with said horizontal portion of said red detector and disposed at a second depth in said semiconductor structure shallower than said first depth and selected to maximize absorption of green photons, said green detector having a vertical portion, said green detector disposed within a second charge container forming a potential well around said green detector, said horizontal portion of said green detector having a substantially uniform doping density in a substantially horizontal direction and said vertical portion of said green detector having a doping density that is decreasing as a monotonic function of depth towards said upper surface and being devoid of potential wells;
a blue detector comprising semiconductor material doped to a first conductivity type, said blue detector having a horizontal portion substantially vertically aligned with said horizontal portion of said red detector and disposed at a third depth in said semiconductor structure shallower than said second depth and selected to maximize absorption of blue photons, said blue detector having a vertical portion, said blue detector disposed within a third charge container forming a potential well around said blue detector, said horizontal portion of said blue detector having a substantially uniform doping density in a substantially horizontal direction and said vertical portion of said blue detector having a doping density that is decreasing as a monotonic function of depth towards said upper surface and being devoid of potential wells;
a first charge-transfer device disposed substantially at an upper surface of said semiconductor structure and coupled to said vertical portion of said red detector;
a second charge-transfer device disposed substantially at an upper surface of said semiconductor structure and coupled to said vertical portion of said green detector; and
a third charge-transfer device disposed substantially at an upper surface of said semiconductor structure and coupled to said vertical portion of said blue detector.

28. The complete-charge-transfer vertical-color-filter detector group of claim 27 fabricated on a p-type semiconductor substrate.

29. The complete-charge-transfer vertical-color-filter detector group of claim 27 wherein said blue detector is disposed at or near an upper surface of said semiconductor material in which it is formed.

30. The complete-charge-transfer vertical-color-filter detector group of claim 27 further including a p-type epitaxial layer formed over said p-type semiconductor substrate.

31. The complete-charge-transfer vertical-color-filter detector group of claim 27 wherein said first, second, and third charge containers comprise p-type semiconductor material doped to a level higher than that of said first, second, and third detectors.

32. The complete-charge-transfer vertical-color-filter detector group of claim 27 wherein said first, second, and third charge-transfer devices each comprise an integrated mechanical switch device.

33. The complete-charge-transfer vertical-color-filter detector group of claim 27 wherein said first, second, and third charge-transfer devices each comprise a MOS switching device.

34. The complete-charge-transfer vertical-color-filter detector group of claim 27 wherein said first, second, and third charge-transfer devices comprise a MOS switching device having a single sense node coupleable to a collection point for photocharge from said red detector, to a collection point for photocharge from said green detector and to a collection point for photocharge from said blue detector by a common gate.

35. The complete-charge-transfer vertical-color-filter detector group of claim 34 further including:
a reset transistor having a source coupled to said sense node, a drain coupled to a reset-potential node, and a gate coupled to a reset signal source;

a source-follower transistor having a gate coupled to said sense node, a drain coupled to a source-follower-drain-potential node, and a source; and an output transistor having a drain coupled to said source of said source-follower transistor, a gate coupled to a row-select line, and a source coupled to a column-output line.

36. The complete-charge-transfer vertical-color-filter detector group of claim 27 further including a light shield disposed over said semiconductor structure, said light shield having an aperture substantially vertically aligned with said horizontal portion of said first detector.

37. A complete-charge-transfer vertical-color-filter detector group disposed in a semiconductor structure comprising:

a red detector comprising semiconductor material doped to n-type conductivity and having a horizontal portion disposed at a first depth below an upper surface of the semiconductor structure selected to maximize absorption of red photons, said red detector having a vertical portion, said red detector disposed within a first charge container forming a potential well around said red detector, said horizontal portion of said red detector having a substantially uniform doping density in a substantially horizontal direction and said vertical portion of said red detector having a doping density that is increasing as a monotonic function of depth towards said upper surface and being devoid of potential wells;

a green detector comprising semiconductor material doped to said n-type conductivity, said green detector having a horizontal portion substantially vertically aligned with said horizontal portion of said red detector and disposed at a second depth in said semiconductor structure shallower than said first depth and selected to maximize absorption of green photons, said green detector having a vertical portion, said green detector disposed within a second charge container forming a potential well around said green detector, said horizontal portion of said green detector having a substantially uniform doping density in a substantially horizontal direction and said vertical portion of said green detector having a doping density that is increasing as a monotonic function of depth towards said upper surface and being devoid of potential wells;

a blue detector comprising semiconductor material doped to said n-type conductivity, said blue detector having a horizontal portion substantially vertically aligned with said horizontal portion of said red detector and disposed at a third depth in said semiconductor structure shallower than said second depth and selected to maximize absorption of blue photons, said blue detector having a vertical portion, said blue detector disposed within a third charge container forming a potential well around said blue detector, said horizontal portion of said blue detector having a substantially uniform doping density in a substantially horizontal direction and said vertical portion of said blue detector having a doping density that is increasing as a monotonic function of depth towards said upper surface and being devoid of potential wells;

a first charge-transfer device disposed substantially at an upper surface of said semiconductor structure and coupled to said vertical portion of said red detector;

a second charge-transfer device disposed substantially at an upper surface of said semiconductor structure and coupled to said vertical portion of said green detector; and a third charge-transfer device disposed substantially at an upper surface of said semiconductor structure and coupled to said vertical portion of said blue detector.

38. The complete-charge-transfer vertical-color-filter detector group of claim 37 wherein said first, second, and third charge containers comprise p-type semiconductor material.

39. The complete-charge-transfer vertical-color-filter detector group of claim 37 wherein said blue detector is disposed at or near an upper surface of said semiconductor material in which it is formed.

40. The complete-charge-transfer vertical-color-filter detector group of claim 37 wherein said first, second, and third charge-transfer devices each comprise an integrated mechanical switch device.

41. The complete-charge-transfer vertical-color-filter detector group of claim 37 wherein said first, second, and third charge-transfer devices each comprise a MOS switching device.

42. The complete-charge-transfer vertical-color-filter detector group of claim 37 wherein said first, second, and third charge-transfer devices comprise a MOS switching device having a single sense node coupleable to a collection point for photocharge from said red detector, to a collection point for photocharge from said green detector and to a collection point for photocharge from said blue detector by a common gate.

43. The complete-charge-transfer vertical-color-filter detector group of claim 42 further including:

a reset transistor having a source coupled to said sense node, a drain coupled to a reset-potential node, and a gate coupled to a reset signal source;

a source-follower transistor having a gate coupled to said sense node, a drain coupled to a source-follower-drain-potential node, and a source; and an output transistor having a drain coupled to said source of said source-follower transistor, a gate coupled to a row-select line, and a source coupled to a column-output line.

44. The complete-charge-transfer vertical-color-filter detector group of claim 37 further including a light shield disposed over said semiconductor structure, said light shield having an aperture substantially vertically aligned with said horizontal portion of said first detector.

45. The complete-charge-transfer vertical-color-filter detector group of claim 35, configured in an array having at least two rows and at least two columns.

46. The complete-charge-transfer vertical-color-filter detector group of claim 43, configured in an array having at least two rows and at least two columns.

* * * * *